United States Patent
Iwamoto et al.

(10) Patent No.: US 9,621,128 B2
(45) Date of Patent: Apr. 11, 2017

(54) ELASTIC WAVE DEVICE INCLUDING A HIGH ACOUSTIC VELOCITY FILM AND A LOW ACOUSTIC VELOCITY FILM

(71) Applicant: Murata Manufacturing Co., Ltd., Nagaokakyo-shi, Kyoto-fu (JP)

(72) Inventors: Hideki Iwamoto, Nagaokakyo (JP); Syunsuke Kido, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 223 days.

(21) Appl. No.: 14/576,748

(22) Filed: Dec. 19, 2014

(65) Prior Publication Data

US 2015/0102705 A1    Apr. 16, 2015

Related U.S. Application Data

(63) Continuation of application No. PCT/JP2013/066554, filed on Jun. 17, 2013.

(30) Foreign Application Priority Data

Jun. 22, 2012 (JP) .................. 2012-140396

(51) Int. Cl.
*H03H 9/25* (2006.01)
*H03H 9/02* (2006.01)
(Continued)

(52) U.S. Cl.
CPC ............. *H03H 9/25* (2013.01); *H01L 41/047* (2013.01); *H01L 41/0805* (2013.01);
(Continued)

(58) Field of Classification Search
CPC ........................................................ H03H 9/25
(Continued)

(56) References Cited

U.S. PATENT DOCUMENTS

| 6,642,813 | B1 | 11/2003 | Itakura et al. |
| 2004/0000840 | A1* | 1/2004 | Higuchi ............ H03H 3/10 |
| | | | 310/313 R |

(Continued)

FOREIGN PATENT DOCUMENTS

| JP | 11-274883 A | 10/1999 |
| JP | 2001-196896 A | 7/2001 |

(Continued)

OTHER PUBLICATIONS

Official Communication issued in International Patent Application No. PCT/JP2013/066554, mailed on Aug. 6, 2013.

*Primary Examiner* — J. San Martin
(74) *Attorney, Agent, or Firm* — Keating & Bennett, LLP

(57) ABSTRACT

An elastic wave device includes a high acoustic velocity film configured such that a bulk wave propagates at a higher acoustic velocity than an elastic wave that propagates in a piezoelectric film, a low acoustic velocity film configured such that a bulk wave propagates at a lower acoustic velocity than a bulk wave that propagates in the piezoelectric film is laminated on the high acoustic velocity film, the piezoelectric film is laminated on the low acoustic velocity film, and an IDT electrode is laminated on one surface of the piezoelectric film. In an upper structure section, an energy concentration ratio of a main mode which is an elastic wave is not less than about 99.9% and an energy concentration ratio of a high order mode which is spurious is not more than about 99.5%.

13 Claims, 13 Drawing Sheets

(51) Int. Cl.
*H01L 41/047* (2006.01)
*H01L 41/08* (2006.01)
*H03H 9/17* (2006.01)
*H03H 9/205* (2006.01)

(52) U.S. Cl.
CPC ...... *H03H 9/0222* (2013.01); *H03H 9/02574* (2013.01); *H03H 9/171* (2013.01); *H03H 9/205* (2013.01)

(58) Field of Classification Search
USPC .......................................................... 310/313
See application file for complete search history.

(56) References Cited

U.S. PATENT DOCUMENTS

| | | | | |
|---|---|---|---|---|
| 2008/0028855 | A1* | 2/2008 | Kano | G01C 19/5698 73/504.12 |
| 2013/0285768 | A1* | 10/2013 | Watanabe | H03H 9/0222 333/193 |
| 2014/0152146 | A1* | 6/2014 | Kimura | H03H 9/02228 310/313 B |
| 2014/0203893 | A1* | 7/2014 | Kando | H03H 9/17 333/187 |
| 2015/0008789 | A1* | 1/2015 | Iwamoto | H03H 3/10 310/313 R |
| 2015/0028720 | A1* | 1/2015 | Kando | H03H 9/25 310/313 A |
| 2015/0288345 | A1* | 10/2015 | Bhattacharjee | H03H 9/17 310/321 |
| 2016/0182009 | A1* | 6/2016 | Bhattacharjee | H01L 41/047 310/313 B |

FOREIGN PATENT DOCUMENTS

| | | | | |
|---|---|---|---|---|
| JP | 2004-282232 | A | 10/2004 | |
| JP | 2005-354650 | A | 12/2005 | |
| JP | 2005354650 | A * | 12/2005 | |
| JP | 2007-228225 | A | 9/2007 | |
| JP | WO 2012086639 | A1 * | 6/2012 | .......... H03H 9/0222 |
| WO | 01/28090 | A1 | 4/2001 | |

* cited by examiner

ELASTIC WAVE DEVICE INCLUDING A HIGH ACOUSTIC VELOCITY FILM AND A LOW ACOUSTIC VELOCITY FILM

BACKGROUND OF THE INVENTION

1. Field of the Invention

The present invention relates to elastic wave devices preferably for use in resonators, band-pass filters, and so on, more specifically, elastic wave devices having a structure in which another material is laminated between a support substrate and a piezoelectric layer.

2. Description of the Related Art

Elastic wave devices have been used as resonators, band-pass filters, and the like for years, and recently, they are being requested to operate at higher frequencies than before. Japanese Unexamined Patent Application Publication No. 2004-282232 discloses a surface acoustic wave device in which, on a dielectric substrate, a hard dielectric layer, a piezoelectric film, and an IDT (interdigital transducer) electrode are laminated in that order. In the disclosed surface acoustic wave device, the hard dielectric layer is disposed between the dielectric substrate and the piezoelectric film so as to raise acoustic velocity of a surface acoustic wave. As such, it is described in Japanese Unexamined Patent Application Publication No. 2004-282232 that the above configuration makes it possible for the surface acoustic wave device to operate at higher frequencies.

Japanese Unexamined Patent Application Publication No. 2004-282232 also discloses a structure in which an equal potential layer is provided between a hard dielectric layer and a piezoelectric film. The equal potential layer is formed of a metal or a semiconductor. The equal potential layer is provided so as to equalize a potential at an interface between the piezoelectric film and the hard dielectric layer.

In the surface acoustic wave device disclosed in Japanese Unexamined Patent Application Publication No. 2004-282232, it is intended to obtain a higher acoustic velocity by forming the hard dielectric layer. However, a considerably large propagation loss occurs, and the surface acoustic wave cannot be effectively confined within a piezoelectric thin film. As such, energy of the surface acoustic wave device is leaked to the dielectric substrate. This causes a problem such that characteristics of an elastic wave device are degraded.

SUMMARY OF THE INVENTION

Preferred embodiments of the present invention provide elastic wave devices with favorable characteristics.

An elastic wave device including a piezoelectric film according to a preferred embodiment of the present invention includes a support substrate, a high acoustic velocity film which is located on the support substrate and in which a bulk wave propagates at a higher acoustic velocity than an elastic wave that propagates in the piezoelectric film, a low acoustic velocity film which is laminated on the high acoustic velocity film and in which a bulk wave propagates at a lower acoustic velocity than a bulk wave that propagates in the piezoelectric film, the piezoelectric film laminated on the low acoustic velocity film, and an IDT electrode located on one surface of the piezoelectric film. According to a preferred embodiment of the present invention, in an upper structure section including the high acoustic velocity film, an energy concentration ratio of a main mode which is an elastic wave in use preferably is not less than about 99.9% and an energy concentration ratio of a high order mode which is spurious preferably is not more than about 99.5%, for example.

In an elastic wave device according to a specific aspect of various preferred embodiments of the present invention, in the case in which acoustic velocity of the main mode at an anti-resonant frequency is taken as V1 [m/s], acoustic velocity in the high acoustic velocity film is taken as Vh [m/s], and a film thickness of the high acoustic velocity film normalized with a wavelength λ [m] of the elastic wave is taken as Th (=high acoustic velocity film thickness/λ), V1 and Th satisfy the following relationships at each Vh as described below.

When 4200≤Vh<4400:

$$V1 \leq 125.9 \times Th^2 - 102.0 \times Th + 3715.0$$

When 4400≤Vh<4600:

$$V1 \leq 296.3 \times Th^2 - 253.0 \times Th + 3742.2$$

When 4600≤Vh<4800:

$$V1 \leq 506.1 \times Th^2 - 391.5 \times Th + 3759.2$$

When 4800≤Vh<5000:

$$V1 \leq 768.0 \times Th^2 - 552.4 \times Th + 3776.8$$

When 5000≤Vh<5200:

$$V1 \leq 848.5 \times Th^2 - 541.6 \times Th + 3767.8$$

When 5200≤Vh<5400:

$$V1 \leq 1065.2 \times Th^2 - 709.4 \times Th + 3792.8$$

When 5400≤Vh<5600:

$$V1 \leq 1197.1 \times Th^2 - 695.0 \times Th + 3779.8$$

When 5600≤Vh<5800:

$$V1 \leq 1393.8 \times Th^2 - 843.8 \times Th + 3801.5$$

When 5800≤Vh<6000:

$$V1 \leq 1713.7 \times Th^2 - 1193.3 \times Th + 3896.1$$

When 6000≤Vh:

$$V1 \leq 1839.9 \times Th^2 - 1028.7 \times Th + 3814.1$$

In an elastic wave device according to another specific aspect of various preferred embodiments of the present invention, in the case in which acoustic velocity of the high order mode is taken as V2 [m/s], the acoustic velocity in the high acoustic velocity film is taken as Vh [m/s], and the film thickness of the high acoustic velocity film normalized with the wavelength λ [m] of the elastic wave is taken as Th (=high acoustic velocity film thickness/λ), V2 and Th satisfy the following relationships at each Vh as described below.

When Vh<4200:

$$V2 \geq 187.0 \times Th^2 - 137.0 \times Th + 3919.7$$

When 4200≤Vh<4400:

$$V2 \geq -115.0 \times Th^2 + 515.0 \times Th + 3796.4$$

When 4400≤Vh<4600:

$$V2 \geq -268.4 \times Th^2 + 898.0 \times Th + 3728.8$$

When 4600≤Vh<4800:

$$V2 \geq -352.8 \times Th^2 + 1125.2 \times Th + 3726.8$$

When 4800≤Vh<5000:

$$V2 \geq -568.7 \times Th^2 + 1564.3 \times Th + 3657.2$$

When 5000≤Vh<5200:

$$V2 \geq -434.2 \times Th^2 + 1392.6 \times Th + 3808.2$$

When 5200≤Vh<5400:

$$V2 \geq -576.5 \times Th^2 + 1717.1 \times Th + 3748.3$$

When 5400≤Vh<5600:

$$V2 \geq -602.9 \times Th^2 + 1882.6 \times Th + 3733.7$$

When 5600≤Vh<5800:

$$V2 \geq -576.9 \times Th^2 + 2066.9 \times Th + 3703.7$$

When 5800≤Vh<6000:

$$V2 \geq -627.0 \times Th^2 + 2256.1 \times Th + 3705.7$$

In an elastic wave device according to still another specific aspect of various preferred embodiments of the present invention, in the case in which the acoustic velocity of the high order mode is taken as V2 [m/s], the acoustic velocity in the high acoustic velocity film is taken as Vh [m/s], and the film thickness of the high acoustic velocity film normalized with the wavelength λ [m] of the elastic wave is taken as Th (=high acoustic velocity film thickness/λ), V2 and Th satisfy the following relationships at each Vh as described below.

When Vh<4200:

$$V2 \geq 197.8 \times Th^2 - 158.0 \times Th + 4128.5$$

When 4200≤Vh<4400:

$$V2 \geq -119.5 \times Th^2 + 523.8 \times Th + 3992.7$$

When 4400≤Vh<4600:

$$V2 \geq -274.0 \times Th^2 + 908.9 \times Th + 3924.2$$

When 4600≤Vh<4800:

$$V2 \geq -372.3 \times Th^2 + 1162.9 \times Th + 3910.9$$

When 4800≤Vh<5000:

$$V2 \geq -573.4 \times Th^2 + 1573.9 \times Th + 3852.8$$

When 5000≤Vh<5200:

$$V2 \geq -443.7 \times Th^2 + 1411.0 \times Th + 4000.5$$

When 5200≤Vh<5400:

$$V2 \geq -557.0 \times Th^2 + 1679.2 \times Th + 3964.2$$

When 5400≤Vh<5600:

$$V2 \geq -581.0 \times Th^2 + 1840.1 \times Th + 3951.6$$

When 5600≤Vh<5800:

$$V2 \geq -570.7 \times Th^2 + 2054.7 \times Th + 3908.8$$

When 5800≤Vh<6000:

$$V2 \geq -731.1 \times Th^2 + 2408.0 \times Th + 3857.0$$

In an elastic wave device according to another specific aspect of various preferred embodiments of the present invention, the acoustic velocity of the bulk wave propagating in the support substrate is lower than the acoustic velocity of the bulk wave propagating in the high acoustic velocity film. In this case, because the acoustic velocity in the substrate is lower, the high order mode is more surely leaked toward the substrate side. This makes it possible to more effectively reduce or prevent an influence of the high order mode.

An elastic wave device according to still another specific aspect of various preferred embodiments of the present invention further includes a second low acoustic velocity film. The second low acoustic velocity film is laminated between the support substrate and the high acoustic velocity film. Furthermore included is the second low acoustic velocity film in which a bulk wave propagates at a lower acoustic velocity than the bulk wave that propagates in the piezoelectric film. In this case, the high order mode is likely to be leaked to the second low acoustic velocity film. Accordingly, the high order mode is leaked more by the second low acoustic velocity film. As such, the degree of freedom in selecting a material for the support substrate is increased.

In the elastic wave device according to another further specific aspect of various preferred embodiments of the present invention, the piezoelectric film is preferably made of lithium tantalate single crystal or lithium niobate single crystal. In this case, a thin film of a piezoelectric substance as a piezoelectric film is easily formed using an ion implantation technique, for example. Moreover, elastic wave devices with various characteristics is provided with ease through selecting a cut-angle.

In elastic wave devices according to various preferred embodiments of the present invention, a high acoustic velocity film and a low acoustic velocity film are disposed between a support substrate and a piezoelectric film. Further, because energy concentration ratios of the main mode and the high order mode are respectively within the above-specified ranges in an upper structure section including the high acoustic velocity film, energy of the elastic wave in use is effectively confined in a portion where the piezoelectric film and the low acoustic velocity film are laminated. In addition, the high order mode which is spurious can be leaked toward the support substrate side of the high acoustic velocity film, thus making it possible to suppress the high order mode spuriousness. As such, favorable resonance characteristics, filter characteristics, and so on are obtained by the elastic wave in use. Moreover, it is possible to significantly reduce or prevent an undesirable response by the high order mode.

The above and other elements, features, steps, characteristics and advantages of the present invention will become more apparent from the following detailed description of the preferred embodiment with reference to the attached drawings.

DETAILED DESCRIPTION OF THE PREFERRED EMBODIMENTS

Hereinafter, the present invention will be clarified by describing specific preferred embodiments of the present invention with reference to the drawings.

Figure 1A:
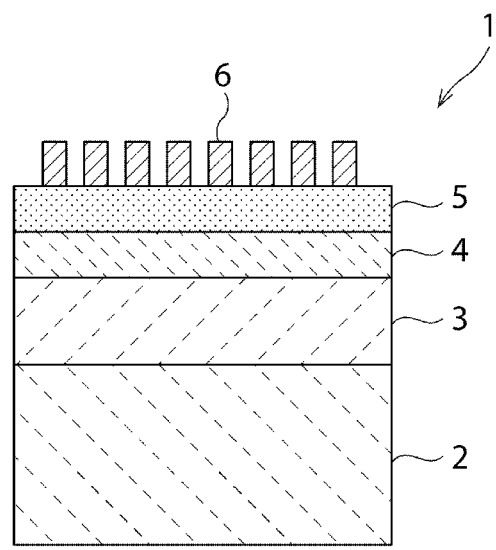
FIG. 1A is a schematic elevational cross-sectional view of a surface acoustic wave device according to a first preferred embodiment of the present invention.

FIG. 1A is a schematic elevational cross-sectional view of a surface acoustic wave device according to a first preferred embodiment of the present invention.

A surface acoustic wave device 1 includes a support substrate 2. A high acoustic velocity film 3 for relatively high acoustic velocity is laminated on the support substrate 2. A low acoustic velocity film 4 for relatively low acoustic velocity is laminated on the high acoustic velocity film 3. Further, a piezoelectric film 5 is laminated on the low acoustic velocity film 4. An IDT electrode 6 is laminated on an upper surface of the piezoelectric film 5. The IDT electrode 6 may be laminated on a lower surface of the piezoelectric film 5.

The support substrate 2 can be formed of any appropriate material as long as the substrate supports a laminated structure including the high acoustic velocity film 3, the low acoustic velocity film 4, the piezoelectric film 5, and the IDT electrode 6. As such material, a piezoelectric substance, a dielectric, a semiconductor, or the like can be used. In the present preferred embodiment, the support substrate 2 is preferably made of glass, for example.

The high acoustic velocity film 3 is configured to confine a surface acoustic wave to a portion where the piezoelectric film 5 and the low acoustic velocity film 4 are laminated. In the present preferred embodiment, the high acoustic velocity film 3 is preferably made of aluminum nitride, for example. Note that, however, as long as the elastic wave is confined in the manner described above, various types of high acoustic velocity materials such as aluminum nitride, aluminum oxide, silicon carbide, silicon nitride, diamond, and the like can be used.

According to the present preferred embodiment, in an upper structure section including the high acoustic velocity film, an energy concentration ratio of a main mode which is an elastic wave in use preferably is not less than about 99.9% and an energy concentration ratio of a high order mode which is spurious is not more than about 99.5%, for example. In other words, the main mode which is an elastic wave in use is confined in the upper structure section above the high acoustic velocity film with certainty. Meanwhile, the high order mode which is spurious is leaked toward the support substrate side. With this, as described later, energy of the elastic wave in use, that is, energy of the main mode is confined to a portion where the piezoelectric film 5 and the low acoustic velocity film 4 are laminated, and the high order mode which is spurious is leaked toward the support substrate 2 side of the high acoustic velocity film 3.

Note that in this specification, a high acoustic velocity film refers to a film in which a bulk wave propagates at a higher acoustic velocity than an elastic wave that propagates in the piezoelectric film 5. Meanwhile, a low acoustic velocity film refers to a film in which a bulk wave propagates at a lower acoustic velocity than a bulk wave that propagates in the piezoelectric film 5. Bulk wave modes that determine acoustic velocity of each of the bulk waves are defined corresponding to usage modes of an elastic wave that propagates in the piezoelectric film 5. Chart 1 below shows a case where the high acoustic velocity film 3 and the low acoustic velocity film 4 are isotropic with respect to a bulk wave propagation direction. That is, corresponding to each of main modes of the elastic wave described in the left column of Chart 1, each of the bulk wave modes in the right column thereof is defined, such that the high acoustic velocity and the low acoustic velocity are determined. Here, a P wave refers to a longitudinal wave, and an S wave refers to a transversal wave.

In Chart 1 below, U1 indicates an elastic wave whose principal component is a P wave, U2 indicates an elastic wave whose principal component is a SH wave, and U3 indicates an elastic wave whose principal component is a SV (Shear Vertical) wave, respectively.

CHART 1

CORRESPONDENCE BETWEEN PIEZOLECTRIC FILM ELASTIC WAVE MODE AND DIELECTRIC FILM BULK WAVE MODE (WHEN DIELECTRIC FILM MATERIAL IS ISOTROPIC)

| MAIN MODE OF ELASTIC WAVE PROPAGATING IN PIEZOELECTRIC FILM | MODE OF BULK WAVE PROPAGATING IN DIELECTRIC FILM |
| --- | --- |
| U1 | P WAVE |
| U2 | S WAVE |
| U3 + U1 | S WAVE |

In the case in which the low acoustic velocity film 4 and the high acoustic velocity film 3 are anisotropic with respect to bulk wave propagation characteristics, the bulk wave modes that determine the high acoustic velocity and the low acoustic velocity are defined as shown in Chart 2 below. Among the bulk wave modes, a wave which is slower in acoustic velocity of the SH wave and the SV wave is called a slower transversal wave, while the faster wave is called a faster transversal wave. Which one will become a slower transversal wave depends on anisotropy of the materials. In the case of $LiTaO_3$, $LiNbO_3$, or the like close to a rotated Y-cut, the SV wave becomes a slower transversal wave and the SH wave becomes a faster transversal wave among the bulk waves.

CHART 2

CORRESPONDENCE BETWEEN PIEZOELECTRIC FILM ELASTIC WAVE MODE AND DIELECTRIC FILM BULK WAVE MODE (WHEN DIELECTRIC FILM MATERIAL IS ANISOTROPIC)

| MAIN MODE OF ELASTIC WAVE PROPAGATING IN PIEZOELECTRIC FILM | MODE OF BULK WAVE PROPAGATING IN DIELECTRIC FILM |
| --- | --- |
| U1 | P WAVE |
| U2 | SH WAVE |
| U3 + U1 | SV WAVE |

As a material of the low acoustic velocity film 4, an appropriate material in which a bulk wave propagates at a lower acoustic velocity than a bulk wave that propagates in the piezoelectric film 5 can be used. As such material, silicon oxide, glass, silicon oxynitride, tantalum oxide, a compound in which fluorine, carbon, or boron is added to silicon oxide, or the like can be used.

The low acoustic velocity film and the high acoustic velocity film are each made of an appropriate dielectric material capable of realizing the high acoustic velocity and the low acoustic velocity determined in the manner discussed above.

The piezoelectric film 5 can be made of an appropriate piezoelectric material, and is preferably made of piezoelectric single crystal, for example. In the case in which the piezoelectric single crystal is used, elastic wave devices with various characteristics are provided with ease through selecting Euler angles. A lithium tantalate single crystal or lithium niobate single crystal is more preferably used, such that resonance characteristics, filter characteristics, and so on of the surface acoustic wave device 1 is further improved through selecting the Euler angles.

In the present preferred embodiment, the IDT electrode 6 is preferably made of Al, for example. Note that, however, the IDT electrode 6 can be made of an appropriate metal material such as Al, Cu, Pt, Au, Ag, Ti, Ni, Cr, Mo, W, an alloy including any one of these metals as a principal component, or the like. Furthermore, the IDT electrode 6 may have a structure in which a plurality of metal films made of these metals or alloys thereof are laminated.

Figure 1B:
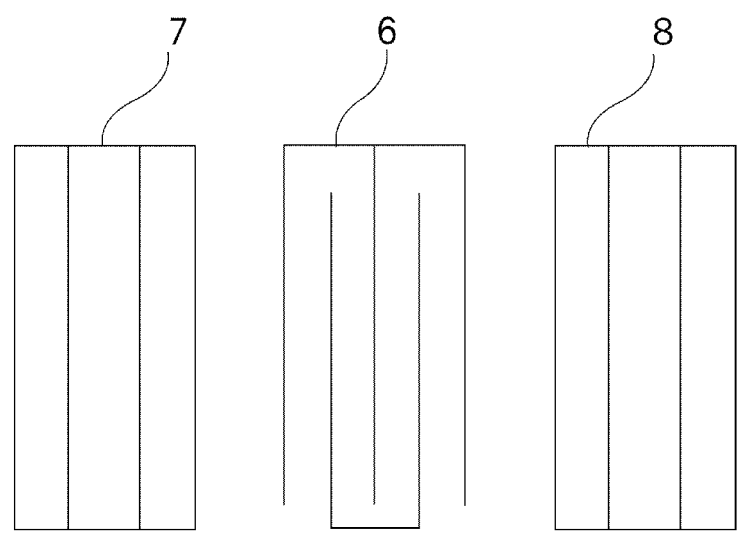
FIG. 1B is a schematic plan view illustrating an electrode structure thereof.

Although schematically illustrated in FIG. 1A, an electrode structure as illustrated in FIG. 1B is located on the piezoelectric film 5. In other words, the IDT electrode 6 is provided, and reflectors 7 and 8 disposed on both sides of the IDT electrode 6 in a surface acoustic wave electrode direction. With this, a one-port type surface acoustic wave resonator is configured. Note that, however, in the present invention, the electrode structure including the IDT electrode is not limited to any specific one, and the structure can be varied so as to configure an appropriate resonator, a ladder filter in which resonators are combined, a longitudinally coupled filter, a lattice type filter, a transversal type filter, and so on.

The surface acoustic wave device 1 of the present preferred embodiment is configured such that the high acoustic velocity film 3, the low acoustic velocity film 4, and the piezoelectric film 5 are laminated in the manner as discussed above, and in an upper structure section including the high acoustic velocity film, the energy concentration ratio of the main mode which is an elastic wave in use preferably is not less than about 99.9% and the energy concentration ratio of the high order mode which is spurious preferably is not more than about 99.5%, for example. With this, the elastic wave in use, that is, the main mode is effectively confined and the high order mode spuriousness is effectively reduced or prevented, which will be described in detail hereinafter.

It has been well-known that disposing a high acoustic velocity film on a lower surface of a piezoelectric substrate can increase acoustic velocity of an elastic wave because part of the elastic wave propagates while distributing energy in the high acoustic velocity film.

Meanwhile, in various preferred embodiments of the present invention, because the low acoustic velocity film 4 is disposed between the high acoustic velocity film 3 and the piezoelectric film 5, acoustic velocity of the elastic wave is lowered. Energy of the elastic wave is essentially concentrated in a low acoustic velocity medium. Accordingly, effectiveness in confining the elastic wave energy to the interior of the piezoelectric film 5 and the interior of the IDT where the elastic wave is excited is improved. As such, according to the present preferred embodiment, it is possible to reduce loss and raise a Q value in comparison with a case where the low acoustic velocity film 4 is not provided. Note that because the low acoustic velocity film 4 is disposed between the high acoustic velocity film 3 and the piezoelectric film 5, the acoustic velocity of the elastic wave is lowered compared to a structure in which the piezoelectric film is provided on the high acoustic velocity film. However, with the structure of various preferred embodiments of the present invention, the acoustic velocity is increased by adequately selecting the piezoelectric film and the low acoustic velocity film in comparison with the structure including only the piezoelectric film. In other words, an operation at higher frequencies is also realized with the structure of preferred embodiments of the present invention.

Moreover, in the present preferred embodiment, in an upper structure section including the high acoustic velocity film, the energy concentration ratio of the main mode which is an elastic wave in use preferably is not less than about 99.9% and the energy concentration ratio of the high order mode which is spurious preferably is not more than about 99.5%, for example. Accordingly, it is possible to confine the energy of the elastic wave to a section ranging down to the high acoustic velocity film 3 and leak the high order mode toward the support substrate side of the high acoustic velocity film 3. This will be described hereinafter with reference to FIG. 2 through FIG. 8.

Figure 4:
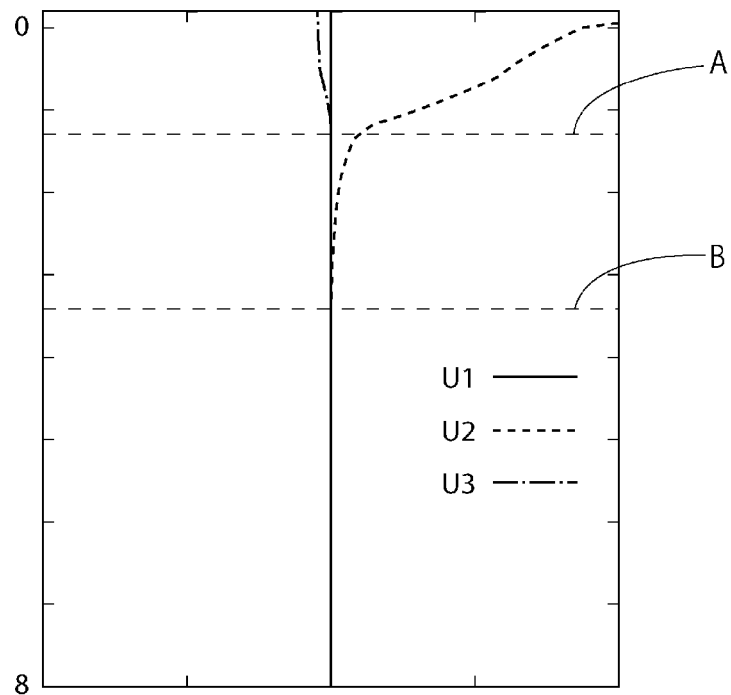
FIG. 4 is a schematic diagram illustrating an energy distribution of a SH wave as a main mode of the surface acoustic wave device, that is, an energy distribution of a U2 component in the case in which a film thickness of a high acoustic velocity film is about 1.0λ.
Figure 5:
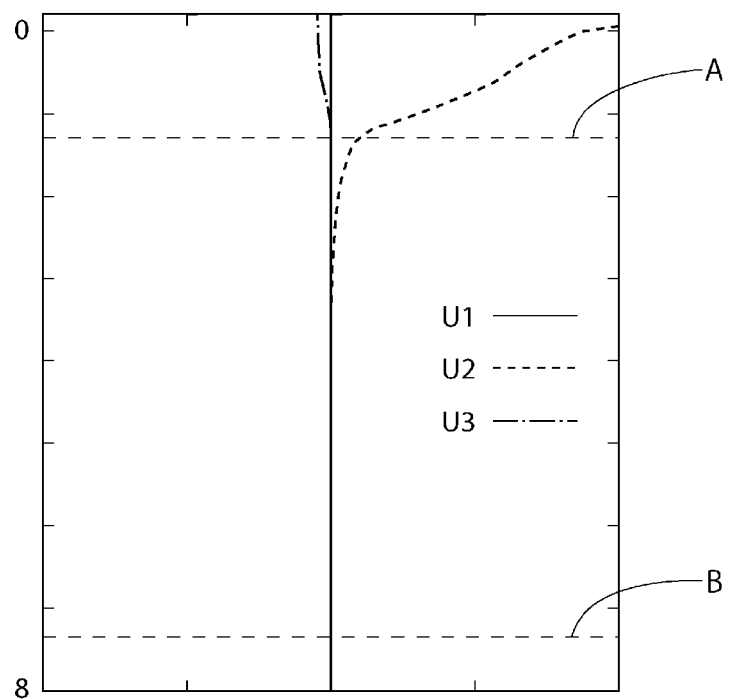
FIG. 5 is a schematic diagram illustrating an energy distribution of a SH wave as a main mode of the surface acoustic wave device, that is, an energy distribution of a U2 component in the case in which a film thickness of a high acoustic velocity film is about 3.0λ.
Figure 6:
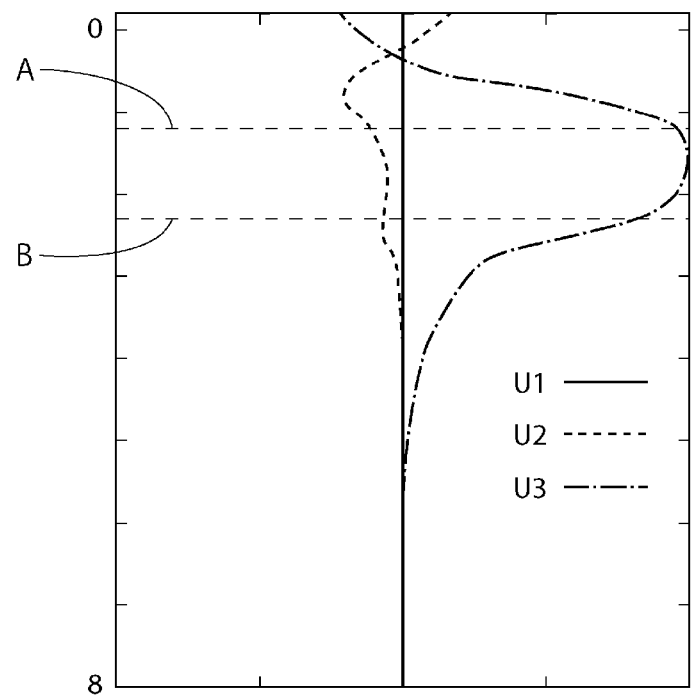
FIG. 6 is a schematic diagram illustrating an energy distribution of U2+U3 components as a high order mode in the case in which a film thickness of a high acoustic velocity film is about 0.5λ.
Figure 7:
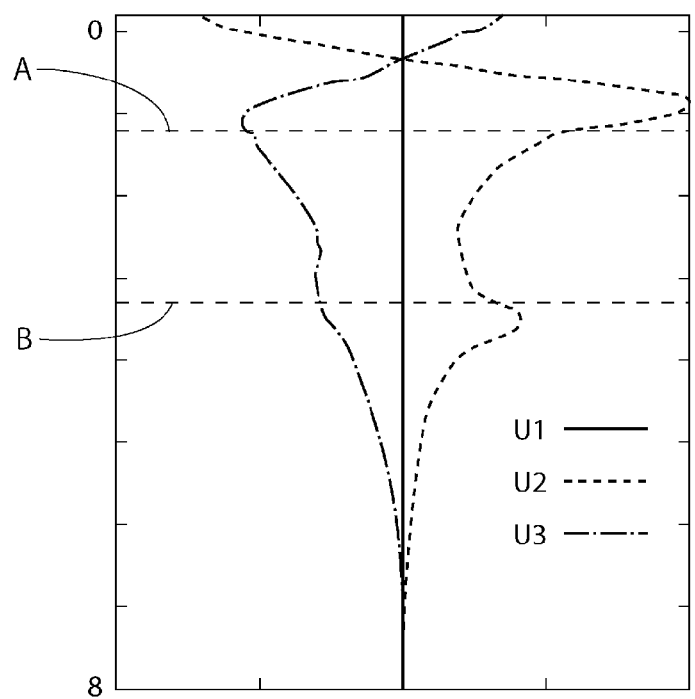
FIG. 7 is a schematic diagram illustrating an energy distribution of U2+U3 components as a high order mode in the case in which a film thickness of a high acoustic velocity film is about 1.0λ.
Figure 8:
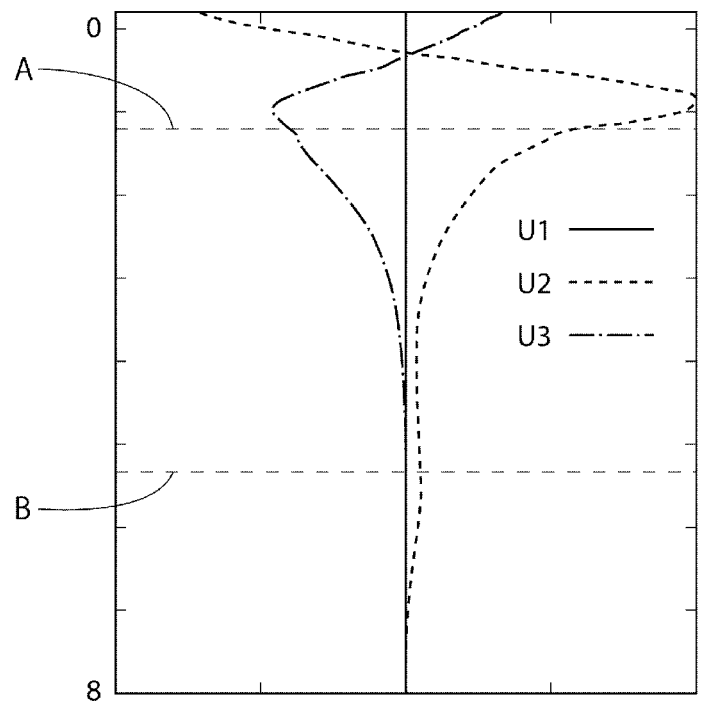
FIG. 8 is a schematic diagram illustrating an energy distribution of U2+U3 components as a high order mode in the case in which a film thickness of a high acoustic velocity film is about 2.0λ.

FIG. 2 through FIG. 5 are diagrams each illustrating an energy distribution of the main mode which is an elastic wave in use, and FIG. 6 through FIG. 8 are diagrams each illustrating an energy distribution of the high order mode. Results illustrated in FIGS. 2 through 8 are those obtained by a finite element method based on the surface acoustic wave device 1 of the following configuration. That is, the structure described in order from top to bottom is: the IDT electrode 6: Al electrode, thickness about 0.08λ/the piezoelectric film 5: LiTaO₃ single crystal film of Y-cut LiTaO₃, thickness about 0.25λ/the low acoustic velocity film 4: silicon oxide film, thickness about 0.34λ/the high acoustic velocity film 3: aluminum nitride film, thickness having been varied between about 0.1λ and about 3.0λ/the support substrate 2: glass substrate. Note that "λ" is a wavelength of the elastic wave determined by the period of electrode fingers of the IDT electrode.

In FIGS. 2 through 5 and FIGS. 6 through 8, the vertical direction of each drawing is a thickness direction of the surface acoustic wave device 1. In each drawing, a broken line A indicates a position of the upper surface of the high acoustic velocity film 3, and a broken line B indicates a position of the lower surface of the high acoustic velocity film 3.

FIGS. 2 through 5 each illustrate an energy distribution of the elastic wave as a main mode when the film thickness of an aluminum nitride film defining the high acoustic velocity film 3 is preferably set to about 0.2λ, about 0.5λ, about 1.0λ, or about 3.0λ, for example. The elastic wave used here is a U2 component shown in FIGS. 2 through 5, that is, a SH wave.

Figure 2:
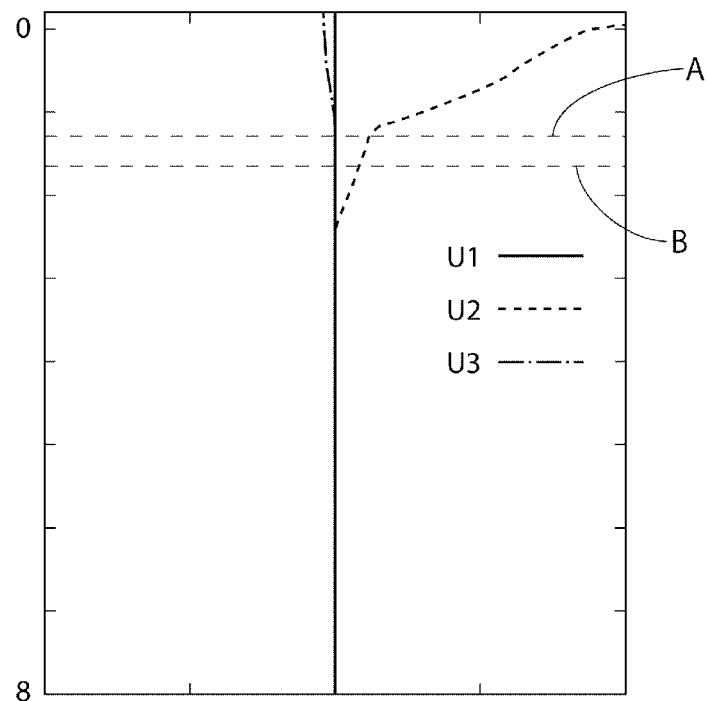
FIG. 2 is a schematic diagram illustrating an energy distribution of a SH (Shear Horizontal) wave as a main mode of the surface acoustic wave device, that is, an energy distribution of a U2 component in the case in which a film thickness of a high acoustic velocity film is about 0.2λ.
Figure 3:
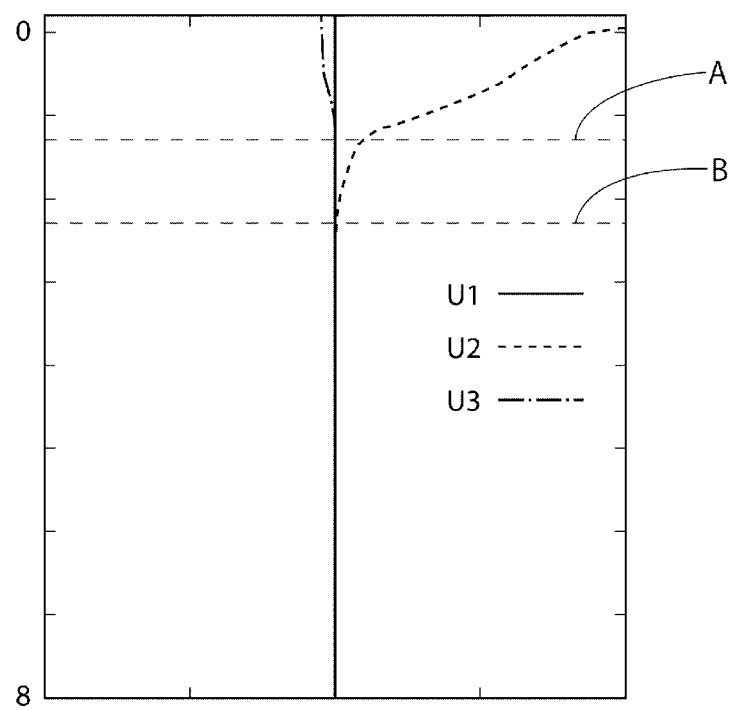
FIG. 3 is a schematic diagram illustrating an energy distribution of a SH wave as a main mode of the surface acoustic wave device, that is, an energy distribution of a U2 component in the case in which a film thickness of a high acoustic velocity film is about 0.5λ.

As is apparent from FIG. 2, when the film thickness of the high acoustic velocity film 3 made of the aluminum nitride film is about 0.2λ, it is understood that the U2 component as a main mode in use is leaked downward beyond the lower surface of the high acoustic velocity film 3. As opposed to this, as shown in FIGS. 3 through 5, when the film thickness of the aluminum nitride film defining the high acoustic velocity film 3 is not less than about 0.5λ, it can be understood that energy of the U2 component, that is, energy of the SH wave is favorably confined at an upper side above the lower surface of the high acoustic velocity film 3. Therefore, it can be understood that energy of the main mode, that is, energy of the elastic wave in use is effectively confined by making the thickness of the high acoustic velocity film 3 not less than about 0.5λ. In this case, not less than about 99.9% of the main mode energy is confined, for example. In other words, the energy concentration ratio of the main mode is not less than about 99.9%, for example.

Meanwhile, FIGS. 6 through 8 each illustrate an energy distribution of a high order mode when the film thickness of the high acoustic velocity film 3 defined by the aluminum nitride film preferably is set to about 0.5λ, about 1.0λ, or about 2.0λ, for example. In this case, U2+U3 components of the high order mode are a problem in that they are spurious. As shown in FIG. 8, when the film thickness of the aluminum nitride film is about 2.0λ, it can be understood that the U2 and U3 components are distributed with large energy at the upper side above the high acoustic velocity film 3. As opposed to this, in each of FIG. 6 and FIG. 7 where the film thickness of the aluminum nitride film is not more than about 1.0λ, the energy concentration ratio of the high order mode toward the upper side of the high acoustic velocity film 3 is lower than the main mode, and it can be understood that the U2+U3 components are considerably leaked toward the support substrate 2 side of the high acoustic velocity film 3.

As such, if the film thickness of the aluminum nitride film is set within a range of about 0.5λ to about 1.0λ in order to take the energy concentration ratio of the main mode as the elastic wave in use to be not less than about 99.9% and to take the energy concentration ratio of the high order mode which is spurious to be not more than about 99.5%, for example, it is possible to confine the main mode energy and leak the high order mode from the high acoustic velocity film 3 toward the support substrate 2 side. As such, it is understood that favorable characteristics caused by the main mode, that is, by the surface acoustic wave is obtained, and out-of-band spuriousness caused by the high order mode is effectively suppressed.

Figure 9:
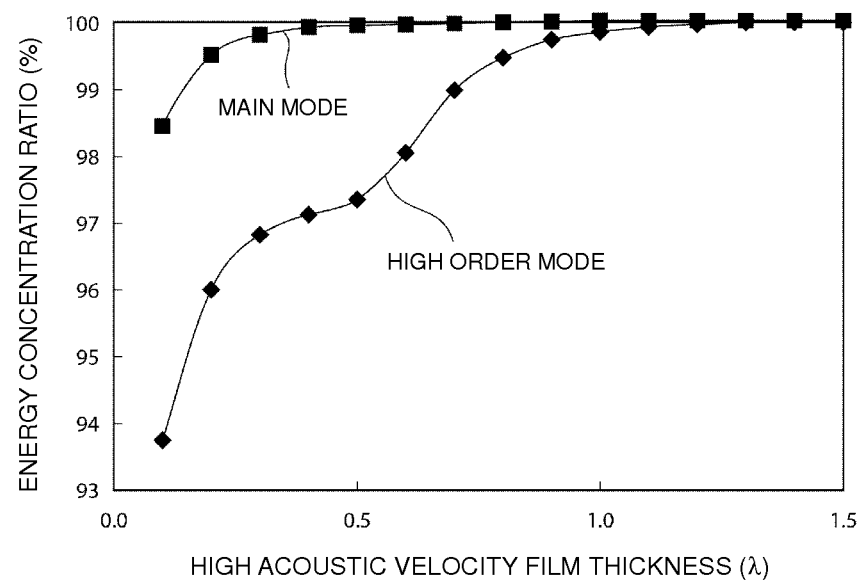
FIG. 9 is a diagram illustrating a relationship between a film thickness of a high acoustic velocity film and an energy concentration ratio of a surface acoustic wave in a preferred embodiment of the present invention.

Incidentally, as one of indices to determine presence/absence of the leakage of elastic wave energy toward the support substrate 2 side, an energy concentration ratio is well-known. FIG. 9 is a diagram illustrating energy concentration ratios of the main mode and the high order mode when the film thickness of the high acoustic velocity film 3 is changed.

In FIG. 9, the vertical axis represents each energy concentration ratio (%) of the main mode and the high order mode. Here, an "energy concentration ratio" indicates a rate of energy of a mode being confined within a laminated structure of the IDT electrode 6, the piezoelectric film 5, the low acoustic velocity film 4, and the high acoustic velocity film 3 with respect to the total energy of the mode. If an energy concentration ratio is 100%, it means that no energy is leaked toward the support substrate 2 side. If the ratio is lower than 100%, the amount of decrease in ratio means a rate of the energy leaking toward the support substrate 2 side. An energy concentration ratio can be calculated by a method as follows: that is, in the case in which energy obtained by integrating each of the energy distributions shown in FIGS. 2 through 8 until reaching a desired depth (down to a lower layer of the high acoustic velocity film 3) is taken as "E1", and the total energy is taken as "E_total", the ratio can be calculated with the following equation.

$$\text{Energy concentration ratio (\%)} = (E1/E\_total \times 100)$$

As is apparent from FIG. 9, when the film thickness of the high acoustic velocity film is not less than about 0.5λ, the energy concentration ratio of the main mode is substantially 100%, for example. Accordingly, it is understood that the main mode is effectively confined. Further, by making the film thickness of the high acoustic velocity film 3 not more than about 1.2λ, for example, it is understood that the high order mode is leaked.

As such, as is apparent from FIG. 9, it is understood that the thickness of the high acoustic velocity film 3 preferably is not less than about 0.5λ and not more than about 1.2λ, for example.

In order to leak the high order mode and suppress the spuriousness, it is preferable for the energy concentration ratio of the high order mode to be not more than about 99.9λ, more preferable to be not more than about 98%, for example. Accordingly, if the film thickness is not more than about 1.2λ, the energy concentration ratio of the high order mode can made less than 100%, thus making it possible to leak the high order mode toward the support substrate side in the manner discussed above. Note that, more preferably, the energy concentration ratio of the high order mode is preferably not more than about 99.5% by making the film thickness of the high acoustic velocity film 3 not more than about 1.0λ, and the energy concentration ratio of the high order mode is not more than about 98% by making the film thickness thereof not more than about 0.8λ, for example. Accordingly, it is preferable for an upper limit of the film thickness of the high acoustic velocity film 3 to be not more than about 1.0λ, and more preferable to be not more than about 0.8λ, for example.

The results illustrated in FIGS. 2 through 9 are evaluation results in the case in which the piezoelectric film 5 is LiTaO$_3$ single crystal, the low acoustic velocity film 4 is silicon oxide, and the high acoustic velocity film 3 is aluminum nitride. However, with various preferred embodiments of the present invention, it has been confirmed that the same results as those illustrated in FIG. 2 through 9 are obtained even in the case in which the piezoelectric film 5, the low acoustic velocity film 4, and the high acoustic velocity film 3 are made of other materials.

Figure 17:
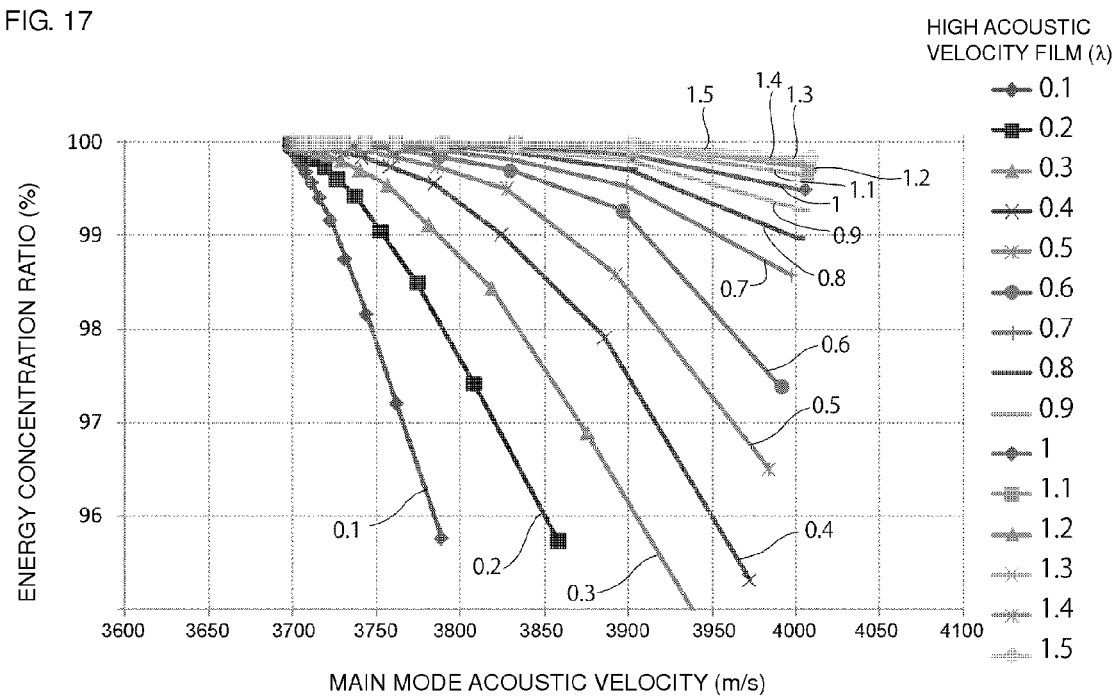
FIG. 17 is a diagram illustrating a relationship among acoustic velocity of a main mode, an energy concentration ratio thereof, and a film thickness of each high acoustic velocity film.
Figure 18:
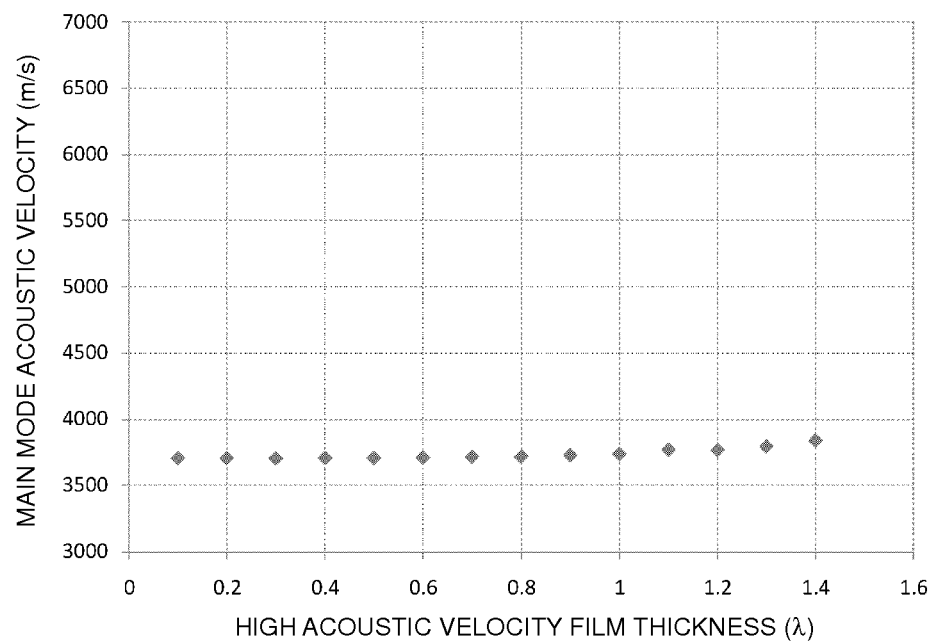
FIG. 18 is a diagram illustrating a relationship between a film thickness of a high acoustic velocity film and acoustic velocity of a main mode.

FIG. 17 is a diagram illustrating a relationship among acoustic velocity of a main mode, an energy concentration ratio thereof, and the film thickness of the high acoustic velocity film in the case in which the Al electrode film thickness preferably is about 0.08λ, the Y-cut LT thickness preferably is about 0.01λ to about 0.5λ, the low acoustic velocity film thickness preferably is about 0.05λ to about 2.00λ, and acoustic velocity in the high acoustic velocity film preferably is about 4200 m/s, for example. The following can be seen in the drawing: that is, as the acoustic velocity of the main mode is higher, the main mode energy is more likely to be leaked; as the film thickness of the high acoustic velocity film is thinner, the main mode energy is likely to be leaked. Here, a relationship between the high acoustic velocity film thickness and the main mode acoustic velocity is plotted in the case in which the main mode energy concentration ratio preferably is about 99.99%, for example. The result thereof is illustrated in FIG. 18. The "main mode acoustic velocity" indicates an acoustic velocity at an anti-resonant frequency.

Figure 19:
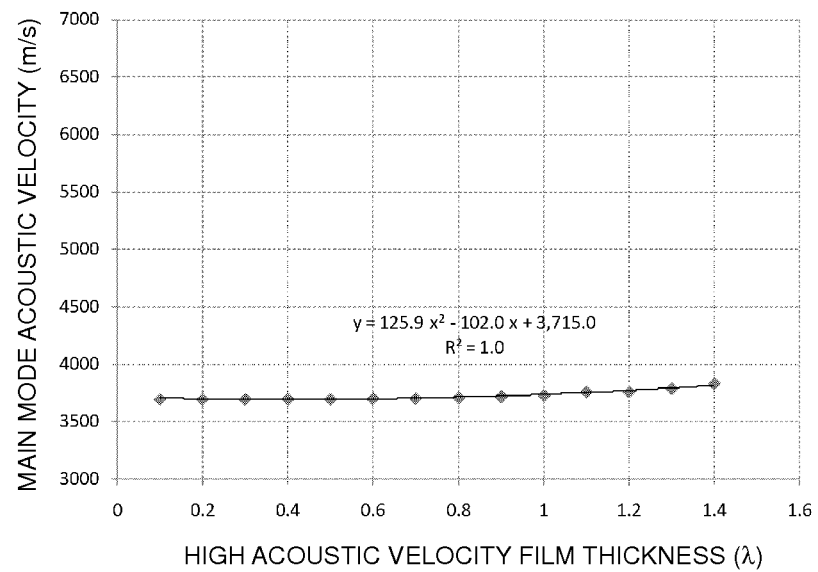
FIG. 19 is a diagram for explaining an approximate equation which expresses a relationship between a film thickness of a high acoustic velocity film and acoustic velocity of a main mode as illustrated in FIG. 18.

In FIG. 18, in the case in which the acoustic velocity of the main mode is lower than the plotted values, the energy concentration ratio of the main mode is about 99.99%, for example. In the case in which the acoustic velocity of the main mode is taken as "y" and the film thickness of the high acoustic velocity film is take as "x" so as to obtain an approximate equation from the result plotted in FIG. 18, an equation of y=125.9 x$^2$−102.0 x+3,715.0 is obtained as shown in FIG. 19. In this case, R$^2$ is 1.0. In other words, in the case in which the acoustic velocity of the main mode at an anti-resonant frequency is taken as V1 [m/s], and the film thickness of the high acoustic velocity film normalized with the wavelength λ [m] of the surface acoustic wave is taken as Th (=high acoustic velocity film thickness/λ), it is sufficient that the following relationship is satisfied.

$$V1 \leq 125.9 \times Th^2 - 102.0 \times Th + 3715.0 \quad (1)$$

Note that, however, although the expression (1) represents a result in the case of Vh=4200 when the acoustic velocity in the high acoustic velocity film is taken as Vh [m/s], the inventors of the present invention have confirmed that it is sufficient to satisfy the expression (1) in a range of 4200≤Vh<4400.

Likewise, the acoustic velocity Vh [m/s] in the high acoustic velocity film was divided into several ranges as follows, and a relationship between the acoustic velocity V1 of the main mode at an anti-resonant frequency and the film thickness Th of the high acoustic velocity film normalized with the wavelength λ [m] of the elastic wave at each acoustic velocity Vh in the high acoustic velocity film was calculated. Each calculation result was as follows.

When 4400≤Vh<4600:

$$V1 \leq 296.3 \times Th^2 - 253.0 \times Th + 3742.2$$

When 4600≤Vh<4800:

$$V1 \leq 506.1 \times Th^2 - 391.5 \times Th + 3759.2$$

When 4800≤Vh<5000:

$$V1 \leq 768.0 \times Th^2 - 552.4 \times Th + 3776.8$$

When 5000≤Vh<5200:

$$V1 \leq 848.5 \times Th^2 - 541.6 \times Th + 3767.8$$

When 5200≤Vh<5400:

$$V1 \leq 1065.2 \times Th^2 - 709.4 \times Th + 3792.8$$

When 5400≤Vh<5600:

$$V1 \leq 1197.1 \times Th^2 - 695.0 \times Th + 3779.8$$

When 5600≤Vh<5800:

$$V1 \leq 1393.8 \times Th^2 - 843.8 \times Th + 3801.5$$

When 5800≤Vh<6000:

$$V1 \leq 1713.7 \times Th^2 - 1193.3 \times Th + 3896.1$$

When 6000≤Vh:

$$V1 \leq 1839.9 \times Th^2 - 1028.7 \times Th + 3814.1$$

Figure 10:
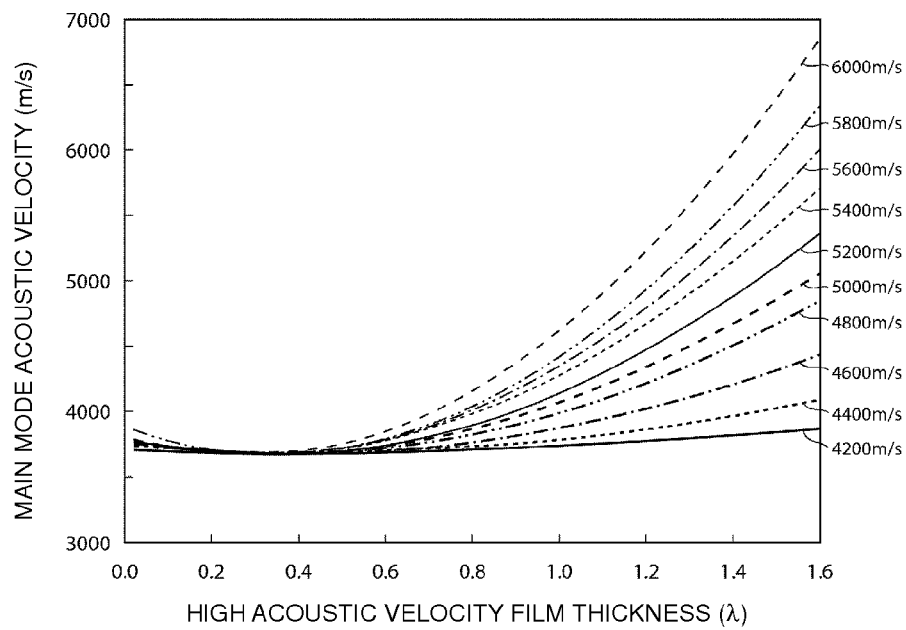
FIG. 10 is a diagram illustrating a relationship among a film thickness of a high acoustic velocity film, acoustic velocity of a main mode which is an elastic wave in use, and acoustic velocity in each high acoustic velocity film.

FIG. 10 is a diagram illustrating a relationship among a film thickness of a high acoustic velocity film, acoustic velocity of an elastic wave in use, that is, acoustic velocity of a main mode, and acoustic velocity of each high acoustic velocity film in use; the relationship was obtained by a finite element method. It is to be noted that in FIG. 10, the relationship when the acoustic velocity in the high acoustic velocity film is 4200 m/s corresponds to the above-mentioned expression (1). Likewise, each of the relationships between the high acoustic velocity film thickness and the main mode acoustic velocity at an acoustic velocity of each high acoustic velocity film was successively calculated, and the result thereof is illustrated in FIG. 10. Each of the calculations was carried out based on the structure as described below.

As described in order from top to bottom the structure includes: the IDT electrode 6: Al electrode, film thickness about 0.08λ/the piezoelectric film 5: Y-cut LiTaO$_3$ single crystal, film thickness about 0.01λ to about 0.50λ/the low acoustic velocity film 4: silicon oxide film, film thickness about 0.05λ to about 2.00λ/the high acoustic velocity film 3: various types of high acoustic velocity films with acoustic velocity about 4200 m/s to about 6000 m/s, film thickness less than about 1.6λ/the support substrate 2: glass substrate.

The acoustic velocity in the high acoustic velocity film can be changed by forming the high acoustic velocity film with different materials; FIG. 10 illustrates the calculation results corresponding to a plurality of types of the high acoustic velocity films in a range of about 4200 m/s to about 6000 m/s.

The main mode acoustic velocity in FIG. 10 indicates acoustic velocity of the main mode at a time when the main mode begins to leak toward the support substrate 2 side in a case where the acoustic velocity in the high acoustic velocity film takes any one of values in the range of about 4200 m/s to about 6000 m/s. If the main mode acoustic velocity is lower than the respective curved lines shown in FIG. 10, the main mode can be completely confined to a portion above the high acoustic velocity film 3, such that favorable device characteristics are obtained. The above-described main mode acoustic velocity control is realized by selecting film thicknesses and materials of the IDT electrode 6, the piezoelectric film 5, and the low acoustic velocity film 4. As an example, in the case in which a surface acoustic wave device is constituted having a first structure example below, the main mode acoustic velocity is approximately 3800 m/s.

First Structure Example

In a first structure example, as described in order from top to bottom the structure includes: the IDT electrode 6: Al film, thickness about 0.08λ/the piezoelectric film 5: Y-cut LiTaO₃ single crystal, thickness about 0.25λ/the low acoustic velocity film 4: SiO₂, thickness about 0.35λ/the high acoustic velocity film 3: aluminum nitride film, acoustic velocity about 5800 m/s.

Figure 11:
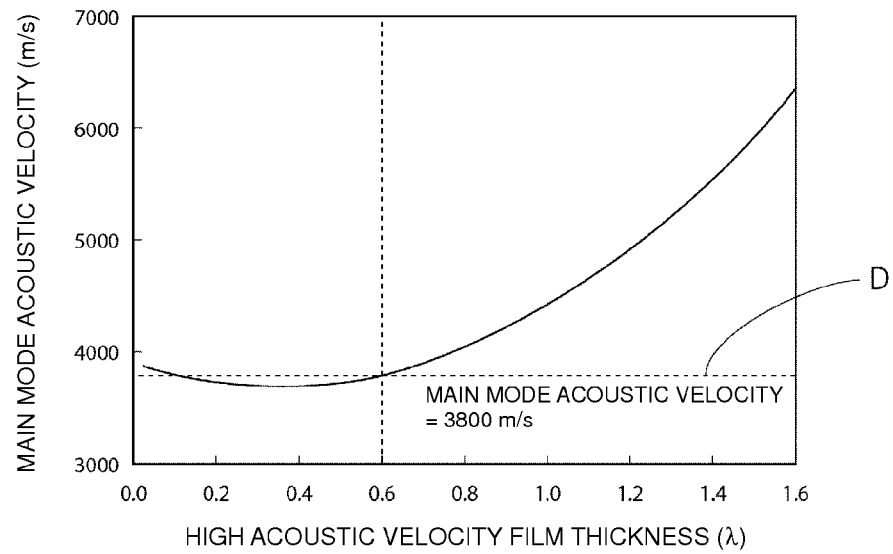
FIG. 11 is a diagram illustrating a relationship between a film thickness of a high acoustic velocity film and acoustic velocity of a main mode which is an elastic wave in use.

FIG. 11 is a diagram illustrating a relationship between a film thickness of a high acoustic velocity film and acoustic velocity of a main mode in the case in which acoustic velocity in the high acoustic velocity film is about 5800 m/s. A curved line in FIG. 11 indicates acoustic velocity at a time when the main mode begins to leak in a case in which the acoustic velocity in the high acoustic velocity film is about 5800 m/s. In a region above the curved line, the main mode leaks so that favorable elastic wave characteristics cannot be obtained. Meanwhile, in a case in which the acoustic velocity of the main mode is about 3800 m/s, the acoustic velocity of the main mode is located on a position indicated by a broken line D. Accordingly, in this case, it is understood that the film thickness of the high acoustic velocity film preferably is not less than about 0.6λ.

As is apparent from the first structure example, by controlling the acoustic velocity in the high acoustic velocity film 3, the film thickness of the high acoustic velocity film 3, and the acoustic velocity of the main mode, the main mode is more completely confined in an effective manner.

Also in FIGS. 10 and 11, the IDT electrode was preferably made of Al, the piezoelectric film 5 preferably was made of LiTaO₃, and the low acoustic velocity film 4 preferably was made of silicon oxide; however, the inventors of the present invention have confirmed that the same relationship holds even if other materials are used. In other words, even in the case in which other structures and materials are used, an optimum film thickness is capable of being set by referring to FIG. 10.

Next, research to find out conditions under which high order mode energy is leaked toward the support substrate 2 side was carried out. A second structure example below is a structure based on which the above research was carried out.

Second Structure Example

In a second structure example, as described in order from top to bottom the structure includes: the IDT electrode 6: Al film, film thickness having been varied/the piezoelectric film 5: Y-cut LiTaO₃ single crystal, film thickness about 0.01λ to about 0.50λ/the low acoustic velocity film 4: silicon oxide, film thickness about 0.05λ to about 2.00λ/the high acoustic velocity film 3: various types of high acoustic velocity films for acoustic velocity about 4200 m/s to about 6000 m/s, film thickness not more than about 1.6λ/the support substrate 2: glass substrate.

Figure 20:
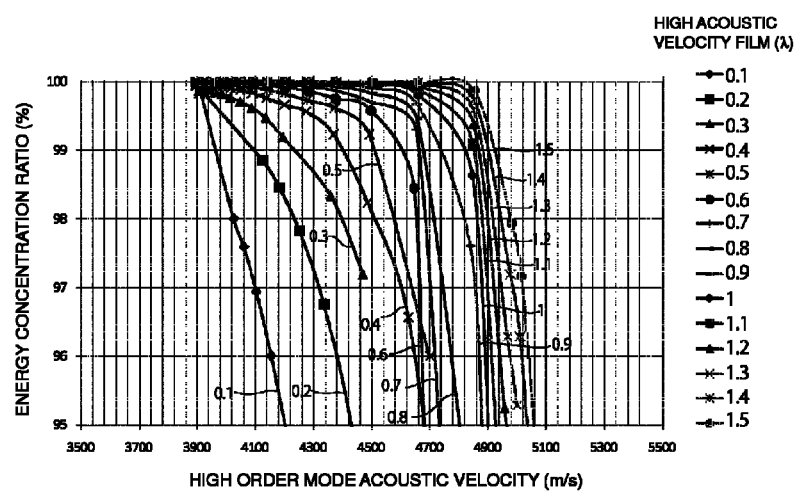
FIG. 20 is a diagram illustrating a relationship among acoustic velocity of a high order mode, an energy concentration ratio thereof, and a film thickness of each high acoustic velocity film.

In the same manner as in the case in which the diagram in FIG. 10 was derived, a relationship between the high acoustic velocity film thickness and the high order mode acoustic velocity was plotted in a case in which the energy concentration ratio of the high order mode is about 99.5%. The result thereof is shown in FIG. 20. Using the result shown in FIG. 20, the relationship was preferably set so that the energy concentration ratio of the high order mode satisfactorily had a value of not more than about 99.5%, for example. Then, the acoustic velocity Vh [m/s] in the high acoustic velocity film was divided into several ranges as follows, and a relationship between the acoustic velocity V2 of the high order mode and the film thickness Th of the high acoustic velocity film normalized with the wavelength λ [m] of the surface acoustic wave at each acoustic velocity Vh in the high acoustic velocity film was calculated. Each calculation result was as follows.

When Vh<4200:

$V2 \geq 187.0 \times Th^2 - 137.0 \times Th + 3919.7$

When 4200≤Vh<4400:

$V2 \geq -115.0 \times Th^2 + 515.0 \times Th + 3796.4$

When 4400≤Vh<4600:

$V2 \geq -268.4 \times Th^2 + 898.0 \times Th + 3728.8$

When 4600≤Vh<4800:

$V2 \geq -352.8 \times Th^2 + 1125.2 \times Th + 3726.8$

When 4800≤Vh<5000:

$V2 \geq -568.7 \times Th^2 + 1564.3 \times Th + 3657.2$

When 5000≤Vh<5200:

$V2 \geq -434.2 \times Th^2 + 1392.6 \times Th + 3808.2$

When 5200≤Vh<5400:

$V2 \geq -576.5 \times Th^2 + 1717.1 \times Th + 3748.3$

When 5400≤Vh<5600:

$V2 \geq -602.9 \times Th^2 + 1882.6 \times Th + 3733.7$

When 5600≤Vh<5800:

$V2 \geq -576.9 \times Th^2 + 2066.9 \times Th + 3703.7$

When 5800≤Vh<6000:

$V2 \geq -627.0 \times Th^2 + 2256.1 \times Th + 3705.7$

Figure 12:
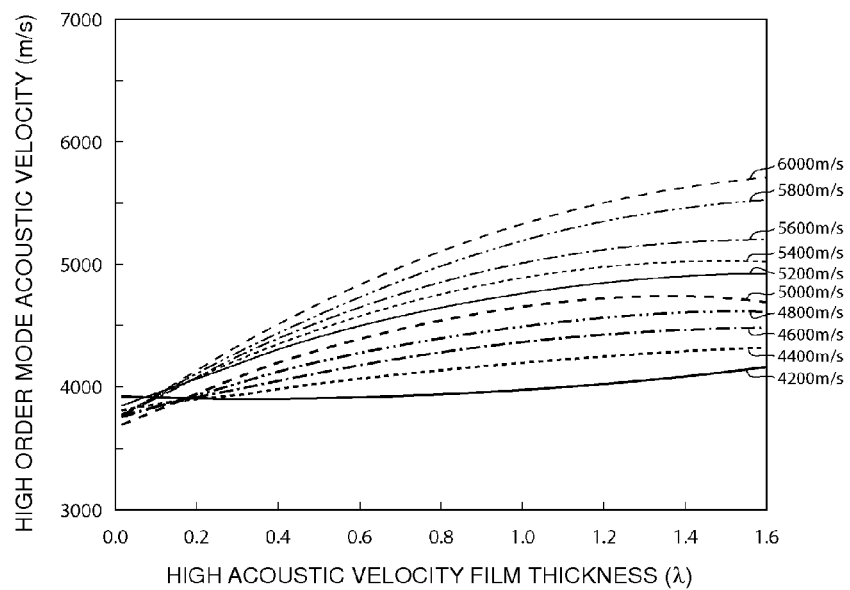
FIG. 12 is a diagram illustrating a relationship among a film thickness of a high acoustic velocity film, acoustic velocity of a high order mode, and acoustic velocity in each high acoustic velocity film in use.

FIG. 12 is a diagram illustrating a relationship among a film thickness of a high acoustic velocity film, acoustic velocity of a high order mode, and acoustic velocity in each high acoustic velocity film. A relationship at an acoustic velocity in each high acoustic velocity film in FIG. 12 corresponds to the above-described relationships. That is, curved lines in FIG. 12 indicate an acoustic velocity of the high order mode at a time when the high order mode begins to leak toward the support substrate 2 side in a case where the acoustic velocity in the high acoustic velocity film takes any one of values in the range of about 4200 m/s to about 6000 m/s, for example. If the high order mode acoustic velocity is higher than the curved lines shown in FIG. 12, the high order mode leaks toward the support substrate 2 side, which makes it possible to cause the high order mode to leak toward the lower side below the high acoustic velocity film 3 and suppress the spuriousness. This high order mode acoustic velocity control is capable of being realized by controlling film thicknesses and materials of the IDT electrode 6, the piezoelectric film 5, and the low acoustic velocity film 4. As an example, a surface acoustic wave device having a structure below will be cited. In this case, the main mode acoustic velocity preferably is about 3800 m/s, and the high order mode acoustic velocity preferably is about 5240 m/s, for example.

Structure

As described in order from top to bottom the structure includes: the IDT electrode 6: Al film, thickness about 0.08λ/the piezoelectric film 5: Y-cut LiTaO$_3$ single crystal, thickness about 0.25λ/the low acoustic velocity film 4: SiO$_2$, thickness about 0.35λ/the high acoustic velocity film 3: aluminum nitride film, acoustic velocity about 5800 m/s, thickness about 0.70λ/glass support substrate.

Figure 13:
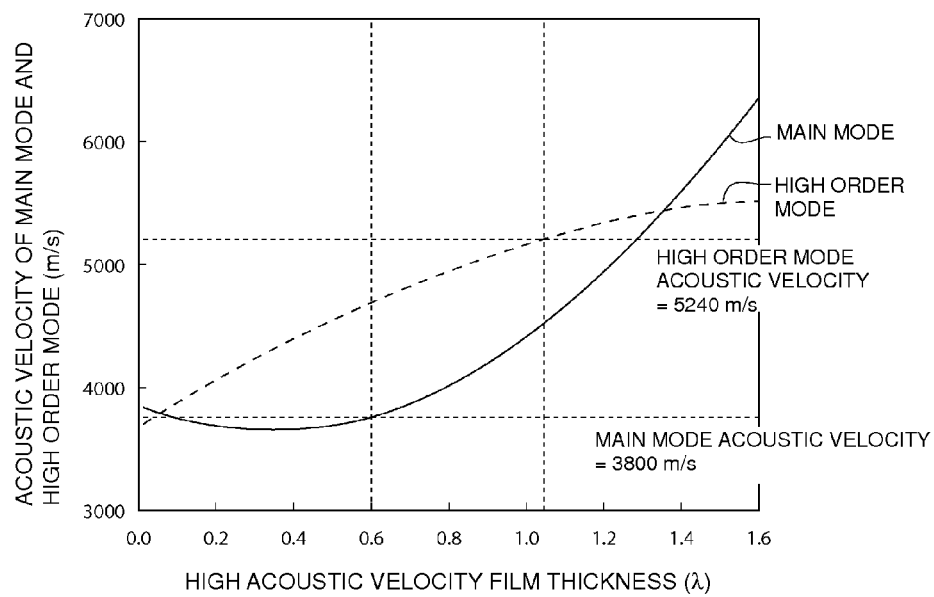
FIG. 13 is a diagram illustrating a relationship between a film thickness of a high acoustic velocity film and acoustic velocity of a main mode which is an elastic wave in use as well as acoustic velocity of a high order mode which is spurious.

FIG. 13 indicates acoustic velocity when the main mode begins to leak and acoustic velocity when the high order mode begins to leak in the case in which acoustic velocity in the high acoustic velocity film 3 is about 5800 m/s. FIG. 13 is a diagram illustrating a relationship between the film thickness of the high acoustic velocity film and acoustic velocity of the main mode as well as acoustic velocity of the high order mode, that is, the diagram indicates acoustic velocity when the main mode begins to leak as well as acoustic velocity when the high order mode begins to leak.

As is apparent from FIG. 13, in the case in which the film thickness of the high acoustic velocity film is not less than about 0.6λ, the main mode is effectively confined when the acoustic velocity of the main mode is about 3800 m/s, for example. Meanwhile, in order to suppress the high order mode, it is sufficient that the film thickness of the high acoustic velocity film is not more than about 1.05λ, for example. Also in the second structure example, even if other structures and materials are used, an optimum film thickness is capable of being set by referring to FIG. 12.

Figure 14:
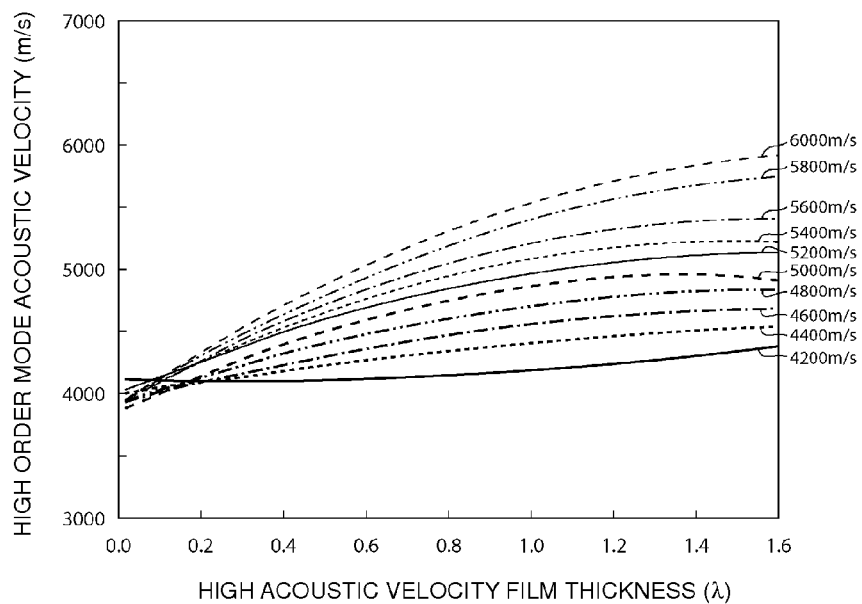
FIG. 14 is a diagram illustrating a relationship among a film thickness of a high acoustic velocity film, acoustic velocity of a high order mode, and acoustic velocity in each high acoustic velocity film in use.

A diagram in FIG. 14 corresponds to the diagram in FIG. 12. In other words, based on the second structure example which was used to obtain the result as shown in FIG. 12, FIG. 14 indicates a relationship among acoustic velocity of the high order mode when the high order mode begins to leak toward the support substrate 2 side, the film thickness of the high acoustic velocity film, and acoustic velocity in each high acoustic velocity film. Note that in this case, the vertical axis represents acoustic velocity of the high order mode at a time when not less than about 2.0% of the high order mode leaks toward the support substrate 2 side, for example. Accordingly, in the result as indicated in FIG. 14, the high order mode leaks more in amount toward the support substrate 2 side than the high order mode in FIG. 12. In other words, by setting the film thickness of the high acoustic velocity film 3 so that the acoustic velocity of the high order mode is higher than curved lines illustrated in FIG. 14, it is possible to cause the high order mode to effectively leak toward the support substrate 2 side.

Figure 21:
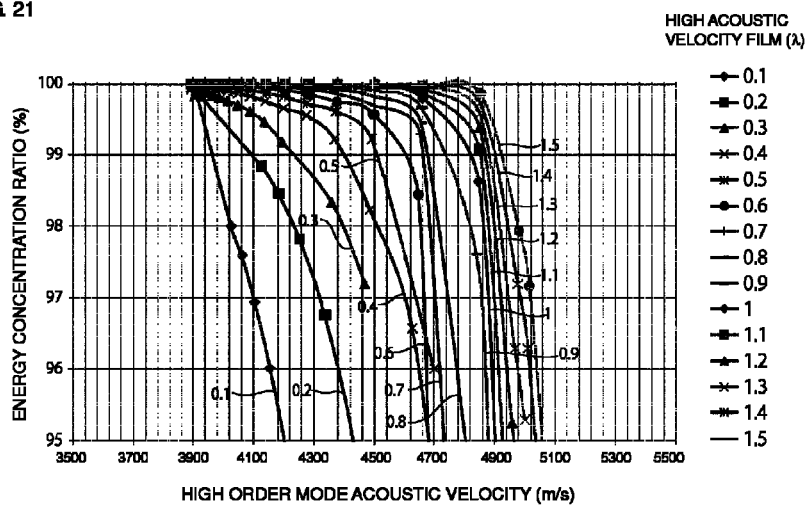
FIG. 21 is a diagram also illustrating a relationship among acoustic velocity of a high order mode, an energy concentration ratio thereof, and a film thickness of each high acoustic velocity film.

The diagram in FIG. 14 was derived in the same manner as in the case in which the diagrams in FIG. 10 and FIG. 12 were derived. That is to say, a relationship between the high acoustic velocity film thickness and the high order mode acoustic velocity was plotted in a case in which the energy concentration ratio of the high order mode is about 98%, for example. The result thereof is shown in FIG. 21. Referring to FIG. 21, the relationship was set so that the energy concentration ratio of the high order mode satisfactorily had a value of not more than about 98%, for example. Then, the acoustic velocity Vh [m/s] in the high acoustic velocity film was divided into several ranges as follows, and a relationship between the acoustic velocity V2 of the high order mode and the film thickness Th of the high acoustic velocity film normalized with the wavelength λ [m] of the surface acoustic wave at each acoustic velocity Vh in the high acoustic velocity film was calculated. Each calculation result was as follows.

When Vh<4200:

$V2 \geq 197.8 \times Th^2 - 158.0 \times Th + 4128.5$

When 4200≤Vh<4400:

$V2 \geq -119.5 \times Th^2 + 523.8 \times Th + 3992.7$

When 4400≤Vh<4600:

$V2 \geq -274.0 \times Th^2 + 908.9 \times Th + 3924.2$

When 4600≤Vh<4800:

$V2 \geq -372.3 \times Th^2 + 1162.9 \times Th + 3910.9$

When 4800≤Vh<5000:

$V2 \geq -573.4 \times Th^2 + 1573.9 \times Th + 3852.8$

When 5000≤Vh<5200:

$V2 \geq -443.7 \times Th^2 + 1411.0 \times Th + 4000.5$

When 5200≤Vh<5400:

$V2 \geq -557.0 \times Th^2 + 1679.2 \times Th + 3964.2$

When 5400≤Vh<5600:

$V2 \geq -581.0 \times Th^2 + 1840.1 \times Th + 3951.6$

When 5600≤Vh<5800:

$V2 \geq -570.7 \times Th^2 + 2054.7 \times Th + 3908.8$

When 5800≤Vh<6000:

$V2 \geq -731.1 \times Th^2 + 2408.0 \times Th + 3857.0$

Figure 15:
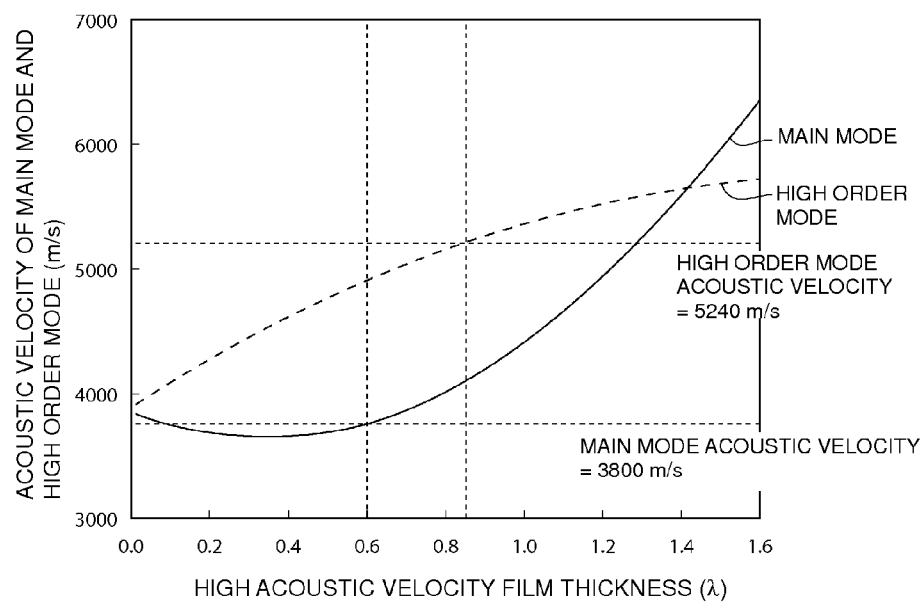
FIG. 15 is a diagram illustrating a relationship between a film thickness of a high acoustic velocity film and acoustic velocity of a main mode which is an elastic wave in use as well as acoustic velocity of a high order mode which is spurious.

In the case in which the acoustic velocity in the high acoustic velocity film is about 5800 m/s in FIG. 14, a relationship between the film thickness of the high acoustic velocity film and acoustic velocity of the main mode as well as acoustic velocity of the high order mode is illustrated in FIG. 15. In FIG. 15, a solid line indicates acoustic velocity when the main mode begins to leak, while a broken indicates acoustic velocity when the high order mode begins to leak. As is apparent from FIG. 15, taking the high acoustic velocity film thickness to be not less than about 0.6λ makes it possible to effectively confine the main mode. Further, taking it to be not more than about 0.85λ makes it possible for the high order mode to be sufficiently leaked. Accordingly, it is preferable for the high acoustic velocity film thickness to be within a range of about 0.6λ to about 0.85λ, for example. In addition, in a case of using other structures and materials, an optimum film thickness can be set by referring to FIG. 14. Under the conditions herein, the high order mode is even more suppressed in comparison with the conditions in FIG. 12.

Although the case of the acoustic velocity of the high acoustic velocity film being about 5800 m/s is explained in FIG. 15, the inventors of the present invention have confirmed that the same explanation can be made even in the case of the acoustic velocity in the high acoustic velocity film taking other values.

In the surface acoustic wave device 1 illustrated in FIG. 1, it is preferable for acoustic velocity in the support substrate 2 to be low. This makes it possible to leak a larger amount of high order mode energy toward the support substrate 2 side. As such, it is preferable for the acoustic velocity in the support substrate 2 to be lower than that in the high acoustic velocity film 3.

Figure 16:
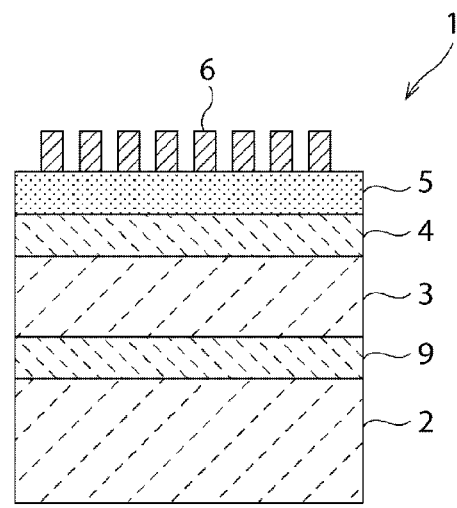
FIG. 16 is a schematic elevational cross-sectional view of a surface acoustic wave device according to another preferred embodiment of the present invention.

In the above preferred embodiments, although a glass substrate is preferably used as the support substrate 2, for example, aluminum may be used instead of the glass. In addition, as shown in FIG. 16, a second low acoustic velocity film 9 may be laminated between the high acoustic velocity film 3 and the support substrate 2. The same material as that of the low acoustic velocity film 4 can be used as the second low acoustic velocity film 9. In the present preferred embodiment, the second low acoustic velocity film 9 preferably is formed of silicon oxide, for example. Using the silicon oxide makes it possible to lower the absolute value of a temperature coefficient of resonant frequency (TCF) and improve the temperature characteristics.

Displacing the second low acoustic velocity film 9 makes it possible to effectively leak the high order mode to the second low acoustic velocity film 9 from the high acoustic velocity film 3 side. As such, even if the support substrate 2 is formed using a support substrate material of high acoustic velocity such as alumina, the high order mode can be leaked downward below the high acoustic velocity film 3. Accordingly, using the second low acoustic velocity film 9 makes it possible to raise the degree of freedom in selecting a material for forming the support substrate 2.

In the case of using LiTaO$_3$ single crystal, LiNbO$_3$ single crystal, or the like, a piezoelectric thin film with thin thickness is easily obtained through a process in which carried out are ion-implantation and a peeling method for peeling a film from the ion-implanted portion.

Third and Fourth Preferred Embodiments

Figure 22:
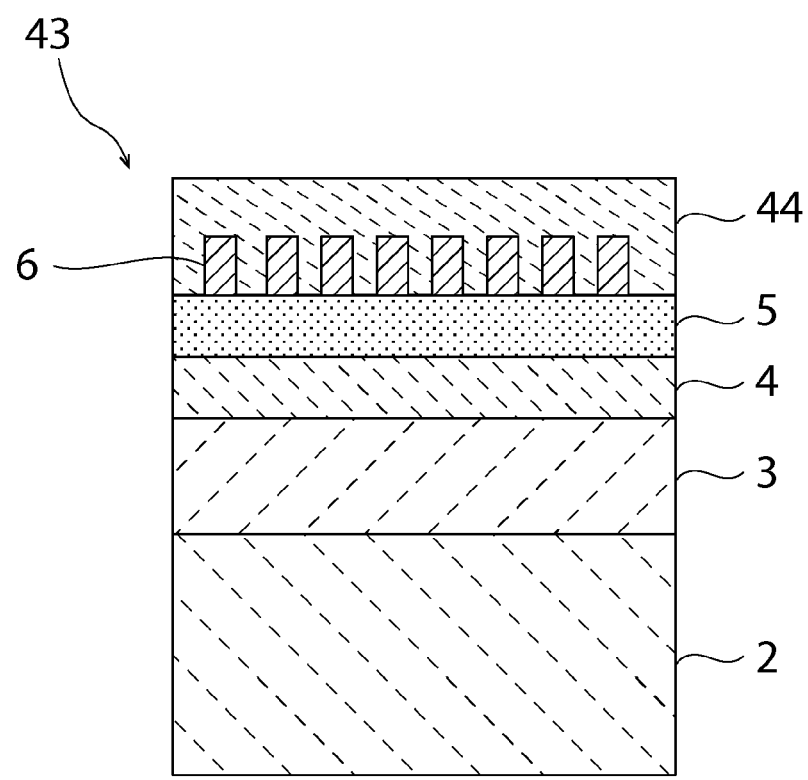
FIG. 22 is a schematic elevational cross-sectional view illustrating a boundary acoustic wave device according to a third preferred embodiment of the present invention.

Surface acoustic wave devices have been described with reference to the above preferred embodiments. However, the present invention can be applied to other elastic wave devices such as a boundary acoustic wave device and the like, and the same effects as those obtained in the foregoing preferred embodiments can be obtained as well when the present invention is applied to those devices. FIG. 22 is a schematic elevational cross-sectional view illustrating a boundary acoustic wave device 43 according to a third preferred embodiment of the present invention. On the lower side of the piezoelectric film 5, the low acoustic velocity film 4, the high acoustic velocity film 3, and the support substrate 2 are laminated in that order from top. This structure is preferably the same or substantially the same as that in the first preferred embodiment. Further, in order to excite a boundary acoustic wave, the IDT electrode 6 is provided at an interface between the piezoelectric film 5 and a dielectric 44 laminated on the piezoelectric film 5.

Figure 23:
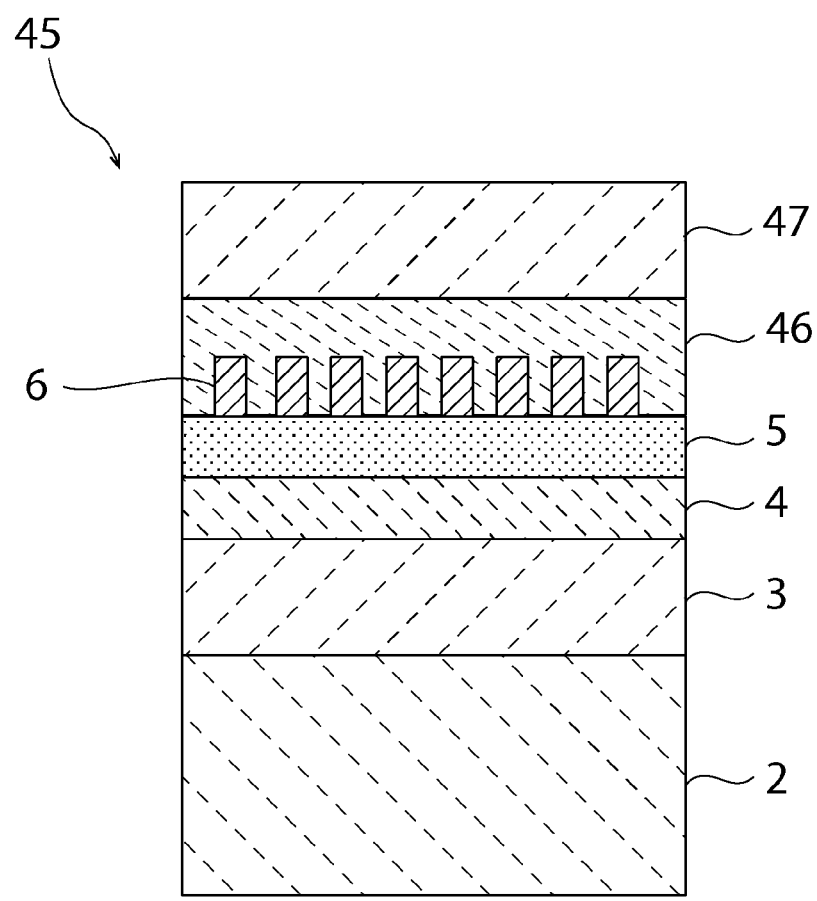
FIG. 23 is a schematic elevational cross-sectional view of a boundary acoustic wave device according to a fourth preferred embodiment of the present invention.

FIG. 23 is a schematic elevational cross-sectional view illustrating a boundary acoustic wave device 45 having a so-called three-medium structure according to a fourth preferred embodiment of the present invention. Also in this preferred embodiment, on the lower side of the piezoelectric film 5, the low acoustic velocity film 4, the high acoustic velocity film 3, and the support substrate 2 are laminated; in addition to this structure, the IDT electrode 6 is provided at an interface between the piezoelectric film 5 and a dielectric 46. Further, on the dielectric 46, laminated is a dielectric 47 in which a transversal wave propagates at a higher acoustic velocity than in the dielectric 46. With this, the boundary acoustic wave device having the so-called three-medium structure is constituted.

Like the boundary acoustic wave devices 43 and 45, a boundary acoustic wave device also obtains the same effects as those obtained in the first preferred embodiment by laminating a laminated structure configured of the low acoustic velocity film 4 and the high acoustic velocity film 3 on the lower side of the piezoelectric film 5 in the same manner as in the surface acoustic wave device 1 according to the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device including a piezoelectric film, the elastic wave device comprising:
   a support substrate;
   a high acoustic velocity film located on the support substrate and configured such that a bulk wave propagates at a higher acoustic velocity than an elastic wave that propagates in the piezoelectric film;
   a low acoustic velocity film located on the high acoustic velocity film and configured such that a bulk wave propagates at a lower acoustic velocity than a bulk wave that propagates in the piezoelectric film;
   the piezoelectric film located on the low acoustic velocity film; and
   an IDT electrode located on one surface of the piezoelectric film; wherein
   an acoustic velocity of a main mode which is an elastic wave in use at an anti-resonant frequency is V1 [m/s], an acoustic velocity in the high acoustic velocity film is Vh [m/s], a film thickness of the high acoustic velocity film normalized with a wavelength λ [m] of the elastic wave is Th, and V1 and Th satisfy for each value of Vh relationships including:
   when 4200≤Vh<4400:

$V1 \leq 125.9 \times Th^2 - 102.0 \times Th + 3715.0$ when 4400≤Vh<4600:

$V1 \leq 296.3 \times Th^2 - 253.0 \times Th + 3742.2$ when 4600≤Vh<4800:

$V1 \leq 506.1 \times Th^2 - 391.5 \times Th + 3759.2$ when 4800≤Vh<5000:

$V1 \leq 768.0 \times Th^2 - 552.4 \times Th + 3776.8$ when 5000≤Vh<5200:

$V1 \leq 848.5 \times Th^2 - 541.6 \times Th + 3767.8$ when 5200≤Vh<5400:

$V1 \leq 1065.2 \times Th^2 - 709.4 \times Th + 3792.8$ when 5400≤Vh<5600:

$V1 \leq 1197.1 \times Th^2 - 695.0 \times Th + 3779.8$ when 5600≤Vh<5800:

$V1 \leq 1393.8 \times Th^2 - 843.8 \times Th + 3801.5$ when 5800≤Vh<6000:

$$V1 \leq 1713.7 \times Th^2 - 1193.3 \times Th + 3896.1$$

when 6000≤Vh:

$$V1 \leq 1839.9 \times Th^2 - 1028.7 \times Th + 3814.1.$$

2. An elastic wave device including a piezoelectric film, the elastic wave device comprising:
 a support substrate;
 a high acoustic velocity film located on the support substrate and configured such that a bulk wave propagates at a higher acoustic velocity than an elastic wave that propagates in the piezoelectric film;
 a low acoustic velocity film located on the high acoustic velocity film and configured such that a bulk wave propagates at a lower acoustic velocity than a bulk wave that propagates in the piezoelectric film;
 the piezoelectric film located on the low acoustic velocity film; and
 an IDT electrode located on one surface of the piezoelectric film; wherein
 an acoustic velocity in the high acoustic velocity film is Vh [m/s], a film thickness of the high acoustic velocity film normalized with a wavelength λ [m] of the elastic wave is Th, an acoustic velocity of a high order mode which is spurious is V2 [m/s], and V2 and Th satisfy for each value of Vh relationships including:
when Vh<4200:

$$V2 \geq 187.0 \times Th^2 - 137.0 \times Th + 3919.7$$

when 4200≤Vh<4400:

$$V2 \geq -115.0 \times Th^2 + 515.0 \times Th + 3796.4$$

when 4400≤Vh<4600:

$$V2 \geq -268.4 \times Th^2 + 898.0 \times Th + 3728.8$$

when 4600≤Vh<4800:

$$V2 \geq -352.8 \times Th^2 + 1125.2 \times Th + 3726.8$$

when 4800≤Vh<5000:

$$V2 \geq -568.7 \times Th^2 + 1564.3 \times Th + 3657.2$$

when 5000≤Vh<5200:

$$V2 \geq -434.2 \times Th^2 + 1392.6 \times Th + 3808.2$$

when 5200≤Vh<5400:

$$V2 \geq -576.5 \times Th^2 + 1717.1 \times Th + 3748.3$$

when 5400≤Vh<5600:

$$V2 \geq -602.9 \times Th^2 + 1882.6 \times Th + 3733.7$$

when 5600≤Vh<5800:

$$V2 \geq -576.9 \times Th^2 + 2066.9 \times Th + 3703.7$$

when 5800≤Vh<6000:

$$V2 \geq -627.0 \times Th^2 + 2256.1 \times Th + 3705.7.$$

3. An elastic wave device including a piezoelectric film, the elastic wave device comprising:
 a support substrate;
 a high acoustic velocity film located on the support substrate and configured such that a bulk wave propagates at a higher acoustic velocity than an elastic wave that propagates in the piezoelectric film;
 a low acoustic velocity film located on the high acoustic velocity film and configured such that a bulk wave propagates at a lower acoustic velocity than a bulk wave that propagates in the piezoelectric film;
 the piezoelectric film located on the low acoustic velocity film; and
 an IDT electrode located on one surface of the piezoelectric film; wherein
 an acoustic velocity in the high acoustic velocity film is Vh [m/s], a film thickness of the high acoustic velocity film normalized with a wavelength λ [m] of the elastic wave is Th, an acoustic velocity of a high order mode which is spurious is V2 [m/s], and V2 and Th satisfy for each value of Vh relationships including:
when Vh<4200:

$$V2 \geq 197.8 \times Th^2 - 158.0 \times Th + 4128.5$$

when 4200≤Vh<4400:

$$V2 \geq -119.5 \times Th^2 + 523.8 \times Th + 3992.7$$

when 4400≤Vh<4600:

$$V2 \geq -274.0 \times Th^2 + 908.9 \times Th + 3924.2$$

when 4600≤Vh<4800:

$$V2 \geq -372.3 \times Th^2 + 1162.9 \times Th + 3910.9$$

when 4800≤Vh<5000:

$$V2 \geq -573.4 \times Th^2 + 1573.9 \times Th + 3852.8$$

when 5000≤Vh<5200:

$$V2 \geq -443.7 \times Th^2 + 1411.0 \times Th + 4000.5$$

when 5200≤Vh<5400:

$$V2 \geq -557.0 \times Th^2 + 1679.2 \times Th + 3964.2$$

when 5400≤Vh<5600:

$$V2 \geq -581.0 \times Th^2 + 1840.1 \times Th + 3951.6$$

when 5600≤Vh<5800:

$$V2 \geq -570.7 \times Th^2 + 2054.7 \times Th + 3908.8$$

when 5800≤Vh<6000:

$$V2 \geq -731.1 \times Th^2 + 2408.0 \times Th + 3857.0.$$

4. The elastic wave device according to claim 1, wherein the acoustic velocity of the bulk wave propagating in the support substrate is lower than the acoustic velocity of the bulk wave propagating in the high acoustic velocity film.

5. The elastic wave device according to claim 1, further comprising:
 a second low acoustic velocity film which is located between the support substrate and the high acoustic velocity film and configured such that a bulk wave propagates at a lower acoustic velocity than the bulk wave that propagates in the piezoelectric film.

6. The elastic wave device according to claim 1, wherein the piezoelectric film is formed of lithium tantalate single crystal or lithium niobate single crystal.

7. The elastic wave device according to claim 1, wherein the high acoustic velocity film is made of one of aluminum nitride, aluminum oxide, silicon carbide, silicon nitride, and diamond.

8. The elastic wave device according to claim 1, wherein the low acoustic velocity film is made of one of silicon oxide, glass, silicon oxynitride, tantalum oxide, and a compound including silicon oxide and one of fluorine, carbon, and boron.

9. The elastic wave device according to claim 1, wherein the IDT electrode is made of one of Al, Cu, Pt, Au, Ag, Ti, Ni, Cr, Mo, W, and an alloy including any one of Al, Cu, Pt, Au, Ag, Ti, Ni, Cr, Mo, and W.

10. The elastic wave device according to claim 1, wherein the elastic wave device is one of a resonator, a ladder filter in which resonators are combined, a longitudinally coupled filter, a lattice filter, and a transversal filter.

11. An elastic wave device including a piezoelectric film, the elastic wave device comprising:
   a support substrate;
   a high acoustic velocity film located on the support substrate and configured such that a bulk wave propagates at a higher acoustic velocity than an elastic wave that propagates in the piezoelectric film;
   a low acoustic velocity film located on the high acoustic velocity film;
   the piezoelectric film located on the low acoustic velocity film; and
   an IDT electrode located on one surface of the piezoelectric film; wherein
   the piezoelectric film is made of one of $LiTaO_3$ or $LiNbO_3$; and
   the low acoustic velocity film is made of one of silicon oxide, glass, silicon oxynitride, tantalum oxide, or, a compound in which fluorine, carbon, or boron is added to silicon oxide; and
   an acoustic velocity of a main mode which is an elastic wave in use at an anti-resonant frequency is V1 [m/s], an acoustic velocity in the high acoustic velocity film is Vh [m/s], a film thickness of the high acoustic velocity film normalized with a wavelength λ [m] of the elastic wave is Th, and V1 and Th satisfy for each value of Vh relationships including:
   when 4200≤Vh<4400:
   $$V1 \le 125.9 \times Th^2 - 102.0 \times Th + 3715.0$$
   when 4400≤Vh<4600:
   $$V1 \le 296.3 \times Th^2 - 253.0 \times Th + 3742.2$$
   when 4600≤Vh<4800:
   $$V1 \le 506.1 \times Th^2 - 391.5 \times Th + 3759.2$$
   when 4800≤Vh<5000:
   $$V1 \le 768.0 \times Th^2 - 552.4 \times Th + 3776.8$$
   when 5000≤Vh<5200:
   $$V1 \le 848.5 \times Th^2 - 541.6 \times Th + 3767.8$$
   when 5200≤Vh<5400:
   $$V1 \le 1065.2 \times Th^2 - 709.4 \times Th + 3792.8$$
   when 5400≤Vh<5600:
   $$V1 \le 1197.1 \times Th^2 - 695.0 \times Th + 3779.8$$
   when 5600≤Vh<5800:
   $$V1 \le 1393.8 \times Th^2 - 843.8 \times Th + 3801.5$$
   when 5800≤Vh<6000:
   $$V1 \le 1713.7 \times Th^2 - 1193.3 \times Th + 3896.1$$
   when 6000≤Vh:
   $$V1 \le 1839.9 \times Th^2 - 1028.7 \times Th + 3814.1.$$

12. An elastic wave device including a piezoelectric film, the elastic wave device comprising:
   a support substrate;
   a high acoustic velocity film located on the support substrate and configured such that a bulk wave propagates at a higher acoustic velocity than an elastic wave that propagates in the piezoelectric film;
   a low acoustic velocity film located on the high acoustic velocity film;
   the piezoelectric film located on the low acoustic velocity film; and
   an IDT electrode located on one surface of the piezoelectric film; wherein
   the piezoelectric film is made of one of $LiTaO_3$ or $LiNbO_3$; and
   the low acoustic velocity film is made of one of silicon oxide, glass, silicon oxynitride, tantalum oxide, or, a compound in which fluorine, carbon, or boron is added to silicon oxide; and
   an acoustic velocity in the high acoustic velocity film is Vh [m/s], a film thickness of the high acoustic velocity film normalized with a wavelength λ [m] of the elastic wave is Th, an acoustic velocity of a high order mode which is spurious is V2 [m/s], and V2 and Th satisfy for each value of Vh relationships including:
   when Vh<4200:
   $$V2 \ge 187.0 \times Th^2 - 137.0 \times Th + 3919.7$$
   when 4200≤Vh<4400:
   $$V2 \ge -115.0 \times Th^2 + 515.0 \times Th + 3796.4$$
   when 4400≤Vh<4600:
   $$V2 \ge -268.4 \times Th^2 + 898.0 \times Th + 3728.8$$
   when 4600≤Vh<4800:
   $$V2 \ge -352.8 \times Th^2 + 1125.2 \times Th + 3726.8$$
   when 4800≤Vh<5000:
   $$V2 \ge -568.7 \times Th^2 + 1564.3 \times Th + 3657.2$$
   when 5000≤Vh<5200:
   $$V2 \ge -434.2 \times Th^2 + 1392.6 \times Th + 3808.2$$
   when 5200≤Vh<5400:
   $$V2 \ge -576.5 \times Th^2 + 1717.1 \times Th + 3748.3$$
   when 5400≤Vh<5600:
   $$V2 \ge -602.9 \times Th^2 + 1882.6 \times Th + 3733.7$$
   when 5600≤Vh<5800:
   $$V2 \ge -576.9 \times Th^2 + 2066.9 \times Th + 3703.7$$
   when 5800≤Vh<6000:
   $$V2 \ge -627.0 \times Th^2 + 2256.1 \times Th + 3705.7.$$

13. An elastic wave device including a piezoelectric film, the elastic wave device comprising:
   a support substrate;
   a high acoustic velocity film located on the support substrate and configured such that a bulk wave propagates at a higher acoustic velocity than an elastic wave that propagates in the piezoelectric film;
   a low acoustic velocity film located on the high acoustic velocity film;
   the piezoelectric film located on the low acoustic velocity film; and
   an IDT electrode located on one surface of the piezoelectric film; wherein
   the piezoelectric film is made of one of $LiTaO_3$ or $LiNbO_3$; and
   the low acoustic velocity film is made of one of silicon oxide, glass, silicon oxynitride, tantalum oxide, or, a compound in which fluorine, carbon, or boron is added to silicon oxide; and
   an acoustic velocity in the high acoustic velocity film is Vh [m/s], a film thickness of the high acoustic velocity film normalized with a wavelength λ [m] of the elastic wave is Th, an acoustic velocity of a high order mode which is spurious is V2 [m/s], and V2 and Th satisfy for each value of Vh relationships including:

when Vh<4200:

$$V2 \geq 197.8 \times Th^2 - 158.0 \times Th + 4128.5$$

when 4200≤Vh<4400:

$$V2 \geq -119.5 \times Th^2 + 523.8 \times Th + 3992.7$$

when 4400≤Vh<4600:

$$V2 \geq -274.0 \times Th^2 + 908.9 \times Th + 3924.2$$

when 4600≤Vh<4800:

$$V2 \geq -372.3 \times Th^2 + 1162.9 \times Th + 3910.9$$

when 4800≤Vh<5000:

$$V2 \geq -573.4 \times Th^2 + 1573.9 \times Th + 3852.8$$

when 5000≤Vh<5200:

$$V2 \geq -443.7 \times Th^2 + 1411.0 \times Th + 4000.5$$

when 5200≤Vh<5400:

$$V2 \geq -557.0 \times Th^2 + 1679.2 \times Th + 3964.2$$

when 5400≤Vh<5600:

$$V2 \geq -581.0 \times Th^2 + 1840.1 \times Th + 3951.6$$

when 5600≤Vh<5800:

$$V2 \geq -570.7 \times Th^2 + 2054.7 \times Th + 3908.8$$

when 5800≤Vh<6000:

$$V2 \geq -731.1 \times Th^2 + 2408.0 \times Th + 3857.0.$$

\* \* \* \* \*